United States Patent
Mok et al.

(10) Patent No.: US 7,876,087 B2
(45) Date of Patent: Jan. 25, 2011

(54) PROBE CARD REPAIR USING COUPONS WITH SPRING CONTACTS AND SEPARATE ATACHMENT POINTS

(75) Inventors: Sammy Mok, Cupertino, CA (US); Frank J. Swiatowiec, San Jose, CA (US); Fariborz Agahdel, Los Gatos, CA (US)

(73) Assignee: Innoconnex, Inc., San Jose, CA (US)

( * ) Notice: Subject to any disclaimer, the term of this patent is extended or adjusted under 35 U.S.C. 154(b) by 74 days.

(21) Appl. No.: 11/900,795

(22) Filed: Sep. 12, 2007

(65) Prior Publication Data

US 2008/0061808 A1    Mar. 13, 2008

Related U.S. Application Data

(60) Provisional application No. 60/844,139, filed on Sep. 12, 2006, provisional application No. 60/921,812, filed on Apr. 3, 2007.

(51) Int. Cl.
*G01R 31/28* (2006.01)

(52) U.S. Cl. .................................. 324/158.1; 324/754

(58) Field of Classification Search ......... 324/754–765, 324/158.1
See application file for complete search history.

(56) References Cited

U.S. PATENT DOCUMENTS

| | | | | |
|---|---|---|---|---|
| 4,877,175 A | * | 10/1989 | Jones et al. | 228/102 |
| 5,105,062 A | * | 4/1992 | Jones et al. | 219/121.85 |
| 5,806,181 A | * | 9/1998 | Khandros et al. | 29/874 |
| 5,896,038 A | * | 4/1999 | Budnaitis et al. | 324/760 |
| 5,977,787 A | | 11/1999 | Das et al. | |
| 6,050,829 A | * | 4/2000 | Eldridge et al. | 439/67 |
| 6,426,638 B1 | | 7/2002 | Di Stefano | |
| 6,615,485 B2 | * | 9/2003 | Eldridge et al. | 29/843 |
| 6,627,822 B2 | * | 9/2003 | Jackson et al. | 174/260 |
| 6,710,609 B2 | | 3/2004 | Mok et al. | |
| 6,790,377 B1 | | 9/2004 | Cohen | |
| 6,791,176 B2 | | 9/2004 | Mathieu et al. | |
| 6,917,525 B2 | | 7/2005 | Mok et al. | |
| 6,927,585 B2 | | 8/2005 | Gleason et al. | |
| 6,956,386 B2 | * | 10/2005 | Kim et al. | 324/754 |
| 6,972,485 B2 | * | 12/2005 | Kong et al. | 257/704 |
| 7,140,883 B2 | | 11/2006 | Khandros et al. | |

(Continued)

FOREIGN PATENT DOCUMENTS

WO    WO 03/100446 A2    12/2003

(Continued)

*Primary Examiner*—Ha Tran T Nguyen
*Assistant Examiner*—Richard Isla Rodas
(74) *Attorney, Agent, or Firm*—David T. Millers

(57) ABSTRACT

Probecard architectures partition the spring compliance required for IC testing between several different components. Such architectures can provide shorter springs, better impedance control, improved power/ground distribution and more direct paths to tester electronics. The probecards can also use thinner interconnector substrates to conform to the planarity of a DUT and may suspend such a substrate by wires attached to a perimeter edge of the substrate to permit the substrate to tilt. Tilting can also be facilitated by positioning tester-side springs away from the perimeter of the substrate. Low compliance MEMS probes for such architectures can be provided on replaceable coupons having attachment points away from electrical connections, and a method for fabricating probe springs can plate spring material on a membrane deformed by contact with a bumped substrate.

31 Claims, 22 Drawing Sheets

U.S. PATENT DOCUMENTS

| | | |
|---|---|---|
| 7,180,316 B1 | 2/2007 | Ismail et al. |
| 7,242,203 B2 * | 7/2007 | LaMeres et al. ............. 324/758 |
| 7,385,411 B2 | 6/2008 | Eldridge |
| 7,437,813 B2 * | 10/2008 | Tunaboylu et al. ....... 29/402.13 |
| 7,524,129 B2 * | 4/2009 | Selle ........................... 403/13 |
| 2003/0192176 A1 * | 10/2003 | Eldridge et al. ............... 29/832 |
| 2006/0011712 A1 * | 1/2006 | Oggioni ..................... 228/254 |
| 2006/0037188 A1 * | 2/2006 | Fukaya et al. ............ 29/603.12 |
| 2007/0057685 A1 | 3/2007 | Garabedian et al. |
| 2008/0001612 A1 * | 1/2008 | Kister ........................ 324/754 |

FOREIGN PATENT DOCUMENTS

WO    WO 2005/031376 A1    4/2005

* cited by examiner

PROBE CARD REPAIR USING COUPONS WITH SPRING CONTACTS AND SEPARATE ATACHMENT POINTS

CROSS-REFERENCE TO RELATED APPLICATIONS

This patent document claims benefit of the earlier filing dates of U.S. Provisional Patent Application No. 60/844,139, filed Sep. 12, 2006 and U.S. Provisional Patent Application No. 60/921,812, filed Apr. 3, 2007, which are hereby incorporated by reference in their entirety.

BACKGROUND

Integrated circuits (ICs) are manufactured and tested in wafer form before being diced from the wafer and mounted in packages, modules, or directly on a printed circuit board. Wafer level IC testing is a critical part of the IC manufacturing process that identifies ICs that do not function properly and provides feedback for repair through programming of redundant logic as well as improving product design and reducing manufacturing cost. Wafer level IC testing also prevents non-functioning ICs from going through the cost of packaging and in some cases can be used for stress testing or burn-in testing at high temperature to screen ICs to improve long term reliability.

Conventional wafer IC testing uses probecards to provide an electrical path between a test system and the pads on integrated circuits while in wafer form. Probecards generally have electrical contact points that match the size and density of the electrical pads on an integrated circuit and conductive patterns that provide the fan-out of electrical signals from these pads to the much larger printed circuit boards and connectors that interface to the test system. The probecard is typically held in place on a wafer prober which moves the IC wafer pads into position to make an electrical connection with the contact points on the probecard. After an integrated circuit or an array of integrated circuits has been aligned, contacted by the prober, and electrically tested, the prober moves the IC wafer to the next integrated circuit or array of integrated circuits so the next set of tests can be performed. The prober generally uses automatic pattern recognition optics to align the contact pads on the wafer and the tips of the probes. After the wafer is in alignment for a test, the prober very precisely raises the wafer to push the probe contact points against aluminum, solder, or other metal pad materials on the integrated circuits. The prober must raise the wafer high enough to create sufficient force to break through any oxides on the integrated circuit's metal pads and make a reliable electrical contact but not so high that probe tips slide off the pad or that the probe tip force causes damage to the circuits under or near the IC pads. This mechanically breaking through the oxide to make an electrical contact is commonly referred to as scrub and the mark left on an IC pad is called a scrub mark. The probecard must compensate for mechanical tolerances in the manufacturing of: 1) the IC wafer, 2) the probe contact points, 3) the probecard electrical interconnect (printed circuit boards, ceramic substrates, flex circuits) and 4) the prober. The probecard must also be designed to compensate for any mechanical movement due to heating of the wafer from the power generated by integrated circuits or by the prober performing high temperature testing as a reliability screen. The probecard must maintain low contact resistance, consistent probe force and alignment during its operating life. Some probecards applications can require a contact life of over a million test cycles.

The semiconductor industry's growth has been driven by delivering faster, smaller, more complex ICs at lower cost. Typically the number of transistors on an IC doubles every 18 to 24 months. This trend requires the test time to increase and the number of interconnect pads on the IC to increase while the pad pitch and size shrink and the frequency at which the IC operates goes up. High frequency operation with a large number of pads significantly increases the bandwidth of an integrated circuit. For high bandwidth applications, the probe-card must also supply large amounts of DC and AC current to power and ground pads and supply signals to input/output pads while not generating noise that affects testing results. Due to electrical limitations, most probecard technologies cannot replicate the high frequency environment that high bandwidth ICs require. These limitations become even more severe as the frequency and number of signals on an IC increase. As a result, traditional techniques for building probecards cannot meet these performance demands. The result of testing with traditional techniques can be the rejection of some good ICs that testing falsely classifies as bad units.

Also, the cost of testing ICs has been rapidly growing as a percentage of the total costs to manufacture ICs. The increasing number of transistors, number of pads and higher frequency operation increases the tester costs and time needed to test ICs. One way to reduce the cost of testing is to test a larger number of ICs at the same time. This higher parallelism improves the test system utilization and reduces the total wafer test time and thus reduces the overall cost of testing. The ultimate level of parallel testing is to test all of the ICs on a wafer at one time.

Most conventional probecards use electrical springs that are designed to be long enough to compensate for the mechanical tolerances and thermal movement encountered while testing in a wafer prober. These springs (or probes) are relatively long (4-8 mm), run parallel to each other and therefore cannot run at high frequency (>1 GHz) due to high mutual and self-inductance. Even at lower frequencies (<100 MHz), high inductance probes have more electrical noise which results in lower test yield (i.e., good ICs are categorized as bad devices).

FIG. 1 is a drawing of a conventional cantilever probe. Each cantilever probe traditionally is manufactured using a tungsten wire 2 with a small tip that is used to contact the aluminum pads of an IC. The probe 2 is generally mounted on a PCB 1. During testing, sufficient force must be applied to the tip of probe 2 as an IC wafer is raised to make a reliable electrical connection by breaking through the oxide (e.g., aluminum oxide) on an IC pad. To keep tungsten probes 2 from deforming or cracking, probes 2 need to be long enough to distribute the stress along the beam. This means a typical probe 2 is more than 5 mm long. The manufacturing process needed to align these probes to the pads on an IC is a manual mechanical placement technique which becomes increasingly difficult to perform as the spacing of the electrical pads become closer together. In most applications, these probes are too long to escape all the signals on a single IC in the space of the IC. This means for full wafer testing their use is restricted to very low pin density applications such as NAND Flash ICs that have relatively large die size with low pin counts or BIST (Built in Self Test) circuits that have fewer than 12 pins per IC. If the cantilever spring is damaged during probing, the repair process generally produces a less reliable probe. The positioning of the repaired probes tends to drift off of the IC pad with increased use. Cantilever probes cannot scale to meet the needs of testing at higher frequencies when migrating to a finer pad pitch. Tighter spacing significantly increases the inductance of the probes. This means that cantilever probes have limited applications for simultaneously contacting all of the pads on a single wafer.

Another conventional approach that has been applied to full wafer testing and burn-in is the use of vertical wires that can flex as an IC wafer is being raised to make an electrical connection. This flexing compensates for the planarity difference between the IC wafer being tested and the probecard PCB (printed circuit board). One approach, as shown in FIG. 2, for manufacturing this type of probecard is to align vertical wires 11 between two plates 10 and 12 with through holes having a slight off-set 13 from each other. The offset 13 provides a predefined bias to the direction the probe wires 11 will bend. The predefined bias keeps probe wires 11 in an array from randomly buckling which could result in adjacent probes shorting together. These vertical wires 11 can buckle enough to compensate for the planarity difference are commonly called buckling beam probes or cobra probes.

One end of a buckling beam probe typically makes electrical contact to a pad on a space transformer that fans out to the electrical connection in the PCB portion of the probecard. The other end of the probe makes electrical contact to the pad on the IC being tested. The space transformer and buckling probes are generally attached to the probecard using a mechanical fixture. This fixture uses adjustment screws to change the tilt of the space transformer so that the probe tips can be made to be parallel to the probecard and/or wafer to be tested.

Another traditional prober system uses a pogo pin which is held in a block that aligns to the IC pads. A pogo pin 20, as shown in FIG. 3, includes a narrow cylinder or barrel that has two spring loaded pins inserted into each end of the cylinder. The pins compress inside of the barrel to compensate for planarity differences as the wafer is pushed into contact with the pogo pins. An example of a pogo pin is shown in FIG. 3.

Both the buckling beam and pogo pin probes need to have long lengths (4-8 mm) to compensate for the planarity mismatch between the printed circuit board that interfaces to the tester and the IC wafer being tested. Also, as IC pad pitch shrinks, the frequency performance of these approaches is reduced. The result can be that good ICs are rejected as bad units. Smaller springs needed for tighter pad pitches are usually more expensive. The above mentioned vertical spring approaches cannot meet the performance or cost needs of IC testing as ICs continue to scale to tighter pitches, higher pin counts and larger probing areas. However, these springs have an advantage in that they are relatively easy to repair when damaged. A damaged spring can be manually removed and replaced with a new spring.

A membrane probe is a prior art approach that typically uses a polyimide film with contact tips. FIG. 4A is a drawing of a membrane probe 80*a*. The compliance of the membrane probe comes from using a flexible film and the force is generated using an elastomer material 68 under the film as shown in FIG. 4B. This elastomer provides a vertical force but it is distributed over the membrane and not focused just on the contact tips 92. Since there is not enough focused force to make a reliable electrical contact to aluminum pads 93 with the elastomer, the tips have been designed to instill a rocking motion to break through oxides on the surface of the aluminum pads and create a small scrub. An example of this tip is shown in FIG. 4B. The tip of the membrane probe must also be raised above the surface of the polyimide film high enough that the film does not touch other parts of the wafer during test. Membrane probes are capable of high performance testing because they can maintain controlled impedance while routing signals to the pins under test. Membrane probes fan out the signals from an IC pitch to a larger PCB pitch. As the number of signals increases, this routing can either be accomplished by using longer and narrower traces or by using a thicker membrane with more layers. The resistance of long narrow traces will not meet the requirements for testing a full wafer of memory ICs. Using more routing layers makes the membrane rigid and it is no longer flexible enough to provide enough compliance to accommodate the planarity differences between the IC wafer and the probecard PCB. Membrane probes are currently fabricated in a 100 mm format. As the size of the manufacturing format grows, the dimensional stability of the membrane is not adequate to stay aligned to the IC pads needed for testing 200 mm or 300 mm wafers. Larger formats also become prohibitively expensive. Even in single IC testing applications, if a membrane is damaged, the entire membrane must be replaced which is a large expense.

Flexible wires have been created as shown in FIG. 6. Such wires can be bonded to a substrate and bent to a shape that that allows the wires to flex. The wire can be plated with nickel to give the wire the required fracture strength and to provide sufficient force to break through the oxide on an IC pad. A custom tip shape is bonded to the top of the wire spring to enable a reliable electrical contact during testing. These wire springs generally need to be between 3-5 mm long to provide enough compliance and force to make electrical connections during probing. These springs can be bonded to a HDI (High Density Interconnect) substrate surface. They are difficult to replace, and repair is limited to springs that are easily accessible near the perimeter of the array of springs.

The traditional probes were designed to test a single IC or a few ICs in parallel. These probes typically needed to test an area less than 15 mm×15 mm. This small testing area allows springs to be fanned out directly to the tester printed circuit board beyond the probe contacting area. Recently, probecards capable of probing a memory wafer with as few as four touchdowns (a quarter of a 300 mm at one time) have been introduced. These probecards need to probe a much larger area and have a probe area size that is at least 160 mm×160 mm. These probecards can simultaneously test as many as 256 DRAMs in parallel. This means that all of the probe contact points for a single IC must escape within the space dictated by the size of the IC. The traditional cantilever probes are too large to escape in the area of a typical memory IC. Although traditional vertical or buckling beam probes can escape within a DRAM die array, they became prohibitively expensive as these probes need to shrink in size when over 10,000 vertical probes are needed to make contact to fine pad pitches of DRAM devices.

MEMS (Micro-Electro-Mechanical Systems) spring based probecards were introduced for the large area and higher pad densities required for parallel memory testing (32 to 256 RAMs tested at one time). These probes are shorter than traditional probes and are capable of fitting within a memory die size. To be able to escape all of the probes within a die site, these probes are mounted on a HDI which serves four purposes: 1) fan out the IC pad density to a pad density that can be routed on a printed circuit board, 2) provide a rigid structure that minimize flexing due to force generated during testing with the very large number of springs, 3) provide a vertical translation (probe depth) to fit in older probers and 4) be able to be become planar to the wafer under test.

An example of the most common MEMS probecard architecture is shown in FIG. 7. The HDI 190 is a multi-layer co-fired ceramic held in place on the top of the HDI with brackets 195. The ceramic thickness is typically 5 to 11 mm. An interposer 191 is placed between the ceramic and the tester PCB to compensate for the planarity between the ceramic and the PCB. The interposer allows the test head (HDI with mounted MEMS springs 194) to be removed for repair and to be mechanically adjusted using screws 193 to align the MEMS spring 194 tips so that they are parallel to the IC wafer being tested.

FIG. 8 is an example of a MEMS spring suitable to be used with the co-fired ceramic space transformer. Each spring 30 is a nickel based spring that is typically 1.5 to 2.0 mm long and 300 microns tall. The spring length is needed to create sufficient force (1.5-3 grams per mil of over drive) to achieve low electrical contact resistance when probing aluminum pads. If the length of the beam 31 is reduced, the nickel beam will fracture during its required lifetime (100,000 to 1,000,000 contacts). This type of MEMS spring has individual springs soldered to the HDI. Repair is very difficult at the customer's manufacturing line and repair is typically limited to springs near the perimeter of an array.

Another MEMS based architecture is shown in FIG. 9. The architecture consists of a probecard PCB 211, a z-block for probe depth adjustment 408, two interposers 406 and 409 with one on either side of the z-block, and an HDI 502 with springs 72 such as shown in FIG. 11 attached. These MEMS based springs use a batch process to fabricate them on a relatively thin ceramic based HDI. The HDI is attached to a "compliant membrane or mesh 552 that keeps the bottom interposer fully compressed at all times by controlling the flex in the decal. The two interposers compensate for planarity differences between the two sides of the z-block, the HDI and the tester PCB. A disadvantage of this approach is that the interposer that makes electrical contact between the z-block and the thin HDI has vertical springs near the active area of the probe and not along the edges of the HDI where it is supported by the compliant membrane or mesh. This force differential can cause the HDI to bow or tent and causes a planarity error at the tips of the probes. This is the same effect as reported in U.S. Pat. Pub. number US2007/0057685, entitled "Lateral Interposer Contact Design and Probecard Assembly" and results in a convex bow 503 as shown in FIG. 10. This convex bow reverses and becomes a concave bow as the wafer under test pushes against the probes. These swings in planarity affect the alignment of the probe tips to the pads being tested. As the pad sizes on the ICs shrink and the number of probes increases, these types of probecard architectures cannot stay aligned to the pads and have a different amount of mechanical scrub depending on the probes location on the HDI. Poor alignment can damage the insulating layer around the IC pads and insufficient mechanical scrub can affect the electrical reliability of the pad to probe contact.

The MEMS spring 72 used in the architecture of FIG. 9 is shown in FIG. 11. The length of this probe is shorter than the MEMS spring 30 shown in FIG. 8. Being a shorter spring, the electrical parameters are better but this type of spring makes contact to the IC pads with a shallow angle which results in a longer scrub mark. As IC pads shrink to smaller sizes it is difficult for probes/springs 72 to scale to the smaller pad areas. These probes need a height of approximately 200 microns to compensate for the planarity difference in the architecture. As the area expands to full wafer memory testing, this architecture will result in a stack up of tolerances that cannot be managed without increasing the spring height. Further, these springs 72 are a batch fabrication on the HDI and cannot be repaired if damaged. The entire probe head must be replaced.

An example of an interposer that limits the vertical force of an interposer on a HDI is shown in system 505 of FIG. 12. A lateral force is applied to the interposer springs for electrical contact. This reduces the vertical force which contributes to the initial bowing of the HDI.

In all of these interposer and HDI based architectures, the probecard is assembled and the frame holding the HDI/probes is adjusted using screws to minimize tilt or bow that affects the x-y-z alignment of the probes to the IC pads. However, this alignment cannot be maintained while the frame is being distorted by the mechanical and thermal forces experienced during the wafer testing process. As the number of IC pads and temperature testing extremes increases, these architectures have difficulty scaling to match the needs.

Another problem encountered when attempting to test a full wafer at one time is that it is difficult to successfully build (yield) a large number of probes (up to 50,000) on the HDI over the area of a 300-mm wafer. One approach to improve the yield is to build smaller HDI substrates with probes in place that are known to be good and then electrically solder or adhesively assemble these "tiles" in place on a larger (>300 mm) substrate. This assembly process must closely control the solder volume or the adhesive thicknesses and the thickness of the individual tiles in order to keep the height of the probes planar over the 300 mm area.

The approaches listed above are attempts to scale probecards to meet the needs of contacting smaller pads, at higher densities and higher frequencies while meeting the mechanical demands of maintaining an excellent electrical contact over larger probing areas and at high temperatures. The approaches attempt to balance the conflicting demands of needing shorter, controlled impedance electrical paths to meet the electrical and density needs against the requirements for longer electrical springs to provide greater mechanical compliance. Many of the traditional approaches cannot probe larger areas because they need to fan out laterally to route out to the tester connectors. Traditional approaches cannot scale to performing high performance testing while simultaneously providing electrical connections to all of the ICs on a full wafer. Scaling of the HDI to match 300 mm and larger wafers is prohibitively expensive.

SUMMARY OF THE INVENTION

Several embodiments of the invention provide probecard architectures that enable partitioning the spring compliance required for ICs testing between several different components in the probecard. Such architectures can provide shorter springs, better impedance control, improved power/ground distribution and more direct paths to tester electronics. The architecture can also reduce the cycle time required to manufacture the probecard and enables fabricating both simpler MEMS probes and HDI substrates which results in a lower probecard manufacturing cost.

In one specific embodiment of the invention, a probecard includes an interconnector substrate, a first spring network, and a second spring network. The first spring network, which provides an interface for making electrical contacts to pads of a device being tested electrically, is connected at a first surface of the interconnector substrate to traces in the interconnector substrate. The second spring network is on a second surface of the interconnector substrate and provides an interface to a tester. The first spring network and the second spring network allow the interconnect substrate to float (instead of being rigidly held) while the probecard is contacting a device being tested.

Another specific embodiment of the invention is a probecard including an interconnector substrate, a first set of springs, and a second set of springs. The first set of springs is electrically connected to the interconnect substrate at a first surface of the interconnector substrate, and the springs in the first set are arranged in a pattern matching terminals of a device being tested. The second set of springs are electrically connected to the interconnect substrate at a second surface of the interconnector substrate, and the springs in the second set are positioned away from a perimeter of the interconnect substrate to permit the interconnect substrate to tilt in response to an orientation of the device when the probecard contacts the device for testing.

Another embodiment of the invention is a probecard including an interconnector substrate, a first set of springs, a second set of springs, and a set of wires. The springs in the first set are arranged in a pattern matching terminals of a device being tested and are electrically connected to the interconnect substrate at a first surface of the interconnector substrate. The second set of springs electrically connected to the interconnect substrate at a second surface of the interconnector substrate and serve in electrically connecting the interconnect substrate to a tester. The wires support the interconnector substrate and attach to the interconnector substrate at an edge that is substantially perpendicular to the first and second surfaces of the interconnector substrate.

Yet another specific embodiment of the invention is a probecard including an interconnector substrate with multiple coupons attached to the interconnect substrate. Each coupon has a set of springs, and the sets of springs on the coupons collectively form a spring network that is electrically connected to interconnect substrate at a surface of the interconnector substrate. The sets of springs on the coupons also form at least a portion of an interface for making electrical contacts to terminals of a device being tested. The attachments of the coupons to the interconnect substrate can be positioned on the coupons away from the springs to permit each of the coupons to be individually removed and replaced if necessary to repair the spring network.

Still another specific embodiment of the invention is a probecard including a set of springs, a membrane, and conductive probe tips. The set of springs are arranged in a pattern matching terminals of a device being tested and are electrically connected to the interconnect substrate. However, the membrane overlies the first set of springs, so that the membrane is between the set of springs and the device being tested. To make electrical contact, the membrane includes conductive vias respectively in electrical contact with the springs, and the conductive probe tips are respectively on the conductive vias on a side of the membrane that is opposite to the springs.

Another specific embodiment of the invention is a process for forming a spring network. The process includes forming a membrane including a patterned conductive material on a support layer and forming bumps on a separate substrate. The membrane can then be pressed against the substrate so that the shape of the membrane conforms to the bumps on the substrate. Plating the membrane with a spring material while the membrane conforms to the bumps on the substrate then forms contoured spring elements when the plated membrane is removed from the substrate.

BRIEF DESCRIPTION OF DRAWINGS

Use of the same reference symbols in different figures indicates similar or identical items.

DETAILED DESCRIPTION OF THE INVENTION

Figure 1:
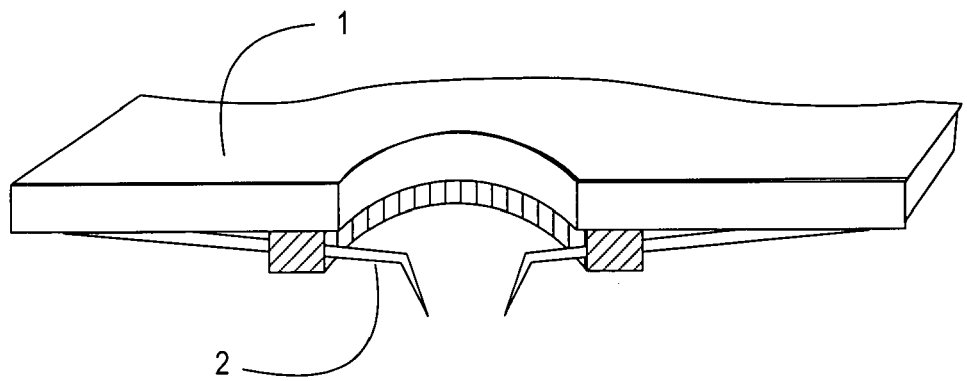
FIG. 1 shows a conventional cantilever probecard.
Figure 2:
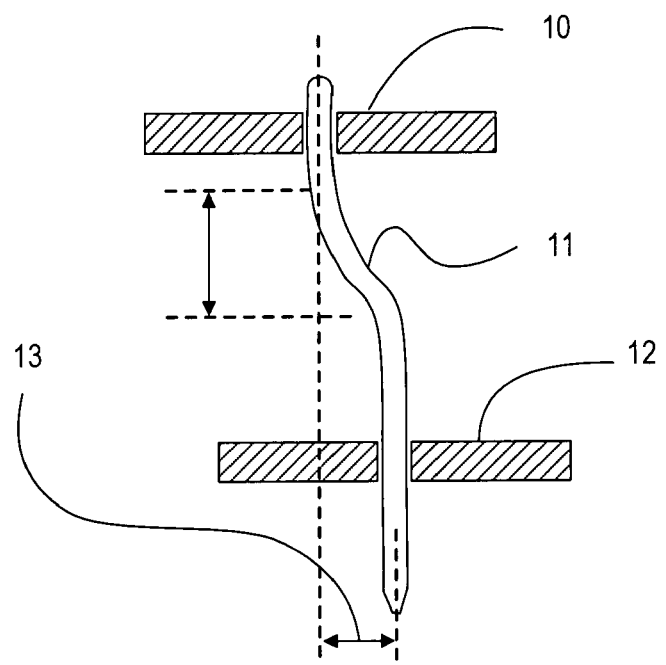
FIG. 2 shows a known Cobra probe or buckling beam probe.
Figure 3:
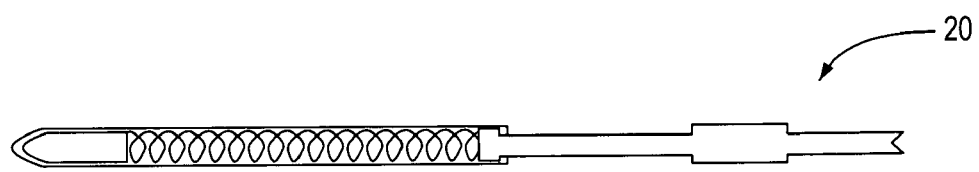
FIG. 3 shows a conventional pogo pin.
Figure 4A:
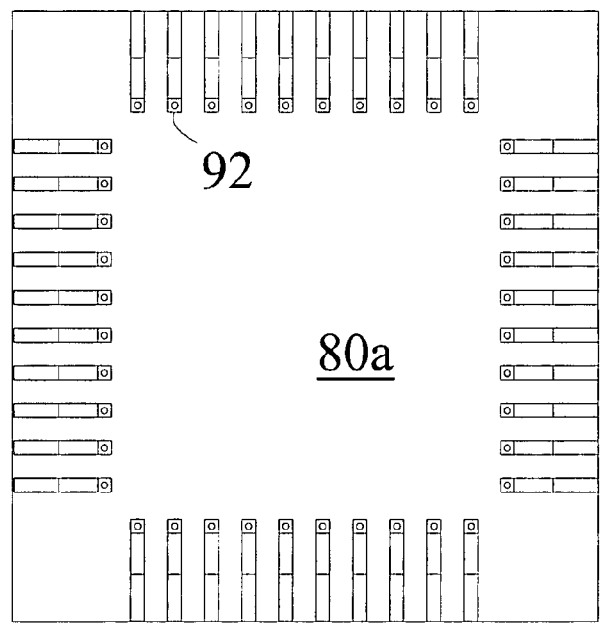
FIG. 4A shows a top view of a conventional membrane probecard.
Figure 4B:
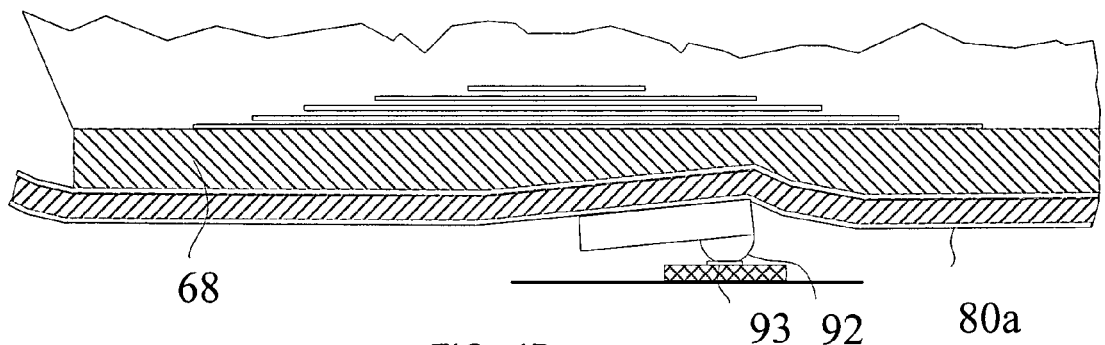
FIG. 4B shows an example of a membrane contact point in the probecard of FIG. 4A.

One objective in integrated circuit testing, particularly in memory testing, is to enable two touchdown or single touchdown full wafer testing applications, while eliminating the need to use an expensive and hard to manufacture 5-11 mm thick co-fired ceramic HDI that is large enough to cover the area of today's 300 mm or larger wafers. The traditional HDI/interposer approaches use a thick HDI to provide mechanical stability to eliminate bowing or flexing. The thick ceramic provides a relatively stiff support and planar surface to keep the springs contacting the DUT wafer to operate within its stress limits while maintain sufficient pressure to effect a reliable electrical contact to the DUT wafer. In contrast, the compliance partitioning architecture allows the HDI to flex and uses two sets of opposing springs to dynamically adjust to keep contact to the IC during testing.

One embodiment of the invention electrically and mechanically attaches low compliance (short) probes, which make contact to the IC pads being tested, to the top side of a floating HDI. The HDI provides signal fan-out to longer and more compliant probes. The longer probes also provide electrical paths from the backside of the HDI to a printed circuit board (PCB) that then further fans out and connects to the IC test system. The HDI is balanced between the 2 sets of probe springs and needs only be supported by wires that holds it rigid in the plane of the DUT wafer, but allowed to dynamically tilt or bend to compensate for any mechanical flexing that occurs during testing. The components are all held in place by a mechanical system that creates a probecard that fits into high volume IC wafer probers. The architecture primarily benefits high density and high pin count applications like parallel memory testing and high end logic processors.

The compliance partitioning can also be applied to high density logic applications. This architecture can route the power/ground and signals through different paths to very short springs before making contact to the IC wafer being tested. High frequency signals are routed through a controlled impedance flex circuit into the HDI to the short contact springs. The power and ground can come directly to the backside of the HDI through the longer probes before being redistributed in the HDI to the contact springs. The results are that power and ground does not interfere with the signals and there is enough space on the bottom of the HDI for capacitors to provide a very clean power and ground distribution environment.

The benefits of using this new architecture and the spring structures are that the architecture helps enable higher probecard performance, higher IC wafer yields and lower probecard manufacturing costs. Having these small dense probes enables the architecture to scale to tighter IC pad pitches, higher pad densities, higher currents and larger areas.

Another objective for integrated circuit testing is to create a simpler low compliance (short) probe that is easily repaired in the field. A C-shaped spring probe has two lever arms that are balanced against each other which reduces the maximum fracture stress seen in the spring material and minimizes the force that is normally needed to anchor the probes to rigid substrates or tiles. The probe structure enables freestanding probes that are held in place by a thin membrane to form a coupon of probes that can be temporarily tacked in place on an HDI. The coupons simplify the repair process allowing repairs to be done at a customer's manufacturing site.

Another objective is to provide a way to protect probe structures during testing. A thin membrane with probe tips on the top side of the membrane and a short conductive path to pads on the back of the membrane can be floated over the top of the short springs. This prevents debris from being trapped between springs and the membrane is easily replaced if tips are damaged. This also provides a variety of contact point materials and shapes, which would be simpler to manufacture than being part of the short springs.

A further objective is a low compliance probe structure that can be easily fabricated. One embodiment of the current invention fabricates such a structure by deforming a flexible membrane and then locking in this deformation by plating the spring material. The result is a probe with a raised lever arm and contact bump that can be attached to the HDI.

One embodiment of the present invention partitions the required probecard compliance into at least two sets of springs. Short springs are used to interface to the IC pads being tested and a longer spring network is used to interface to the tester PCB. Rather than requiring a thick and flat HDI to isolate flexing in an attempt to maintain electrical contact for all the springs, the invention enables the use of a thinner floating HDI.

Figure 13:
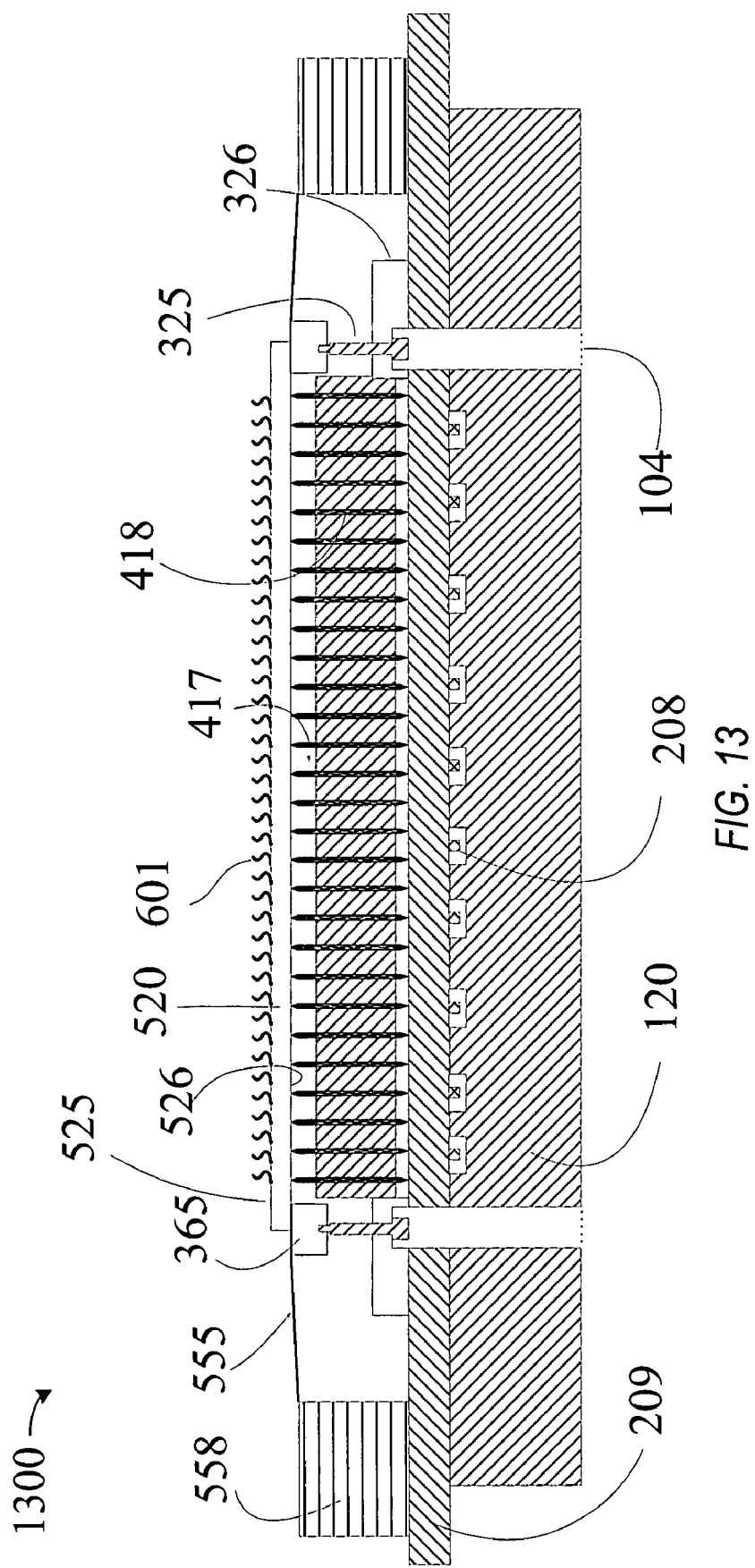
FIG. 13 shows a full wafer level probe architecture using MEMS based probes.

FIG. 13 shows the cross section of a probecard system 1300 in accordance with an embodiment of the invention using compliance partitioning and providing a full wafer single touchdown application. System 1300 contains an HDI substrate 520 which has springs 601 on a surface 525 on the DUT (Device Under Test) side of HDI substrate 520 and springs 417 held in frame 418 on a surface 526 on the tester side of HDI substrate 520. For wafer probing applications, the DUT may be an IC or multiple ICs on a semiconductor wafer.

The HDI substrate 520 would typically be made from a material that would match or be close to matching the CTE (Coefficient of Thermal Expansion) of the DUT wafer. For example, HDI 520 could be ceramic or undoped silicon. The size of HDI 520 would be chosen to match that of the DUT wafer although HDI substrate 520 may be slightly larger than the DUT wafer to aid mechanical fixturing. The thickness of HDI substrate 520 would be chosen to make HDI substrate 520 stiff enough to maintain planarity over a local region such as over the area of one die site, but flexible enough to flex over the entire DUT wafer so that HDI substrate could conform to the surface profile of the DUT wafer under the pressure exerted by the force of the springs 601 and 417. A typical thickness of HDI substrate 520 will be in the 0.5-1.0 mm range, but HDI substrate 520 could function in some applications with other thicknesses, such as substrates ranging from about 0.25 to 3.0 mm thick. HDI substrate 520 will have one or more metal interconnect layers on each surface with metallized vias to electrically connect the metal interconnect traces from one side to those on the other side. The exposed metal interconnect layers on each side will also have pads to mate to the respective springs 601 or 417 contacting that surface. These metal interconnect layers will provide electrical paths interconnecting the metal pads as required by the testing application.

The DUT side springs 601 will electrically connect metal pads surface 525 on the DUT side of the HDI 520 to the electrical terminals on the DUT wafer, which can be metal pads, metal bumps or solder balls. The springs 601 will be placed on the HDI to match the location of the electrical terminals of the DUT wafer and would be typically arranged in groups with each group corresponding to one die site. The groups can be arranged in an array to match the die array on the DUT wafer. Springs 601 could be permanently attached to surface 525 of the HDI or held in contact to the HDI surface 525 in a way to facilitate replacement of springs 601 due to wear or damages.

Figure 23:
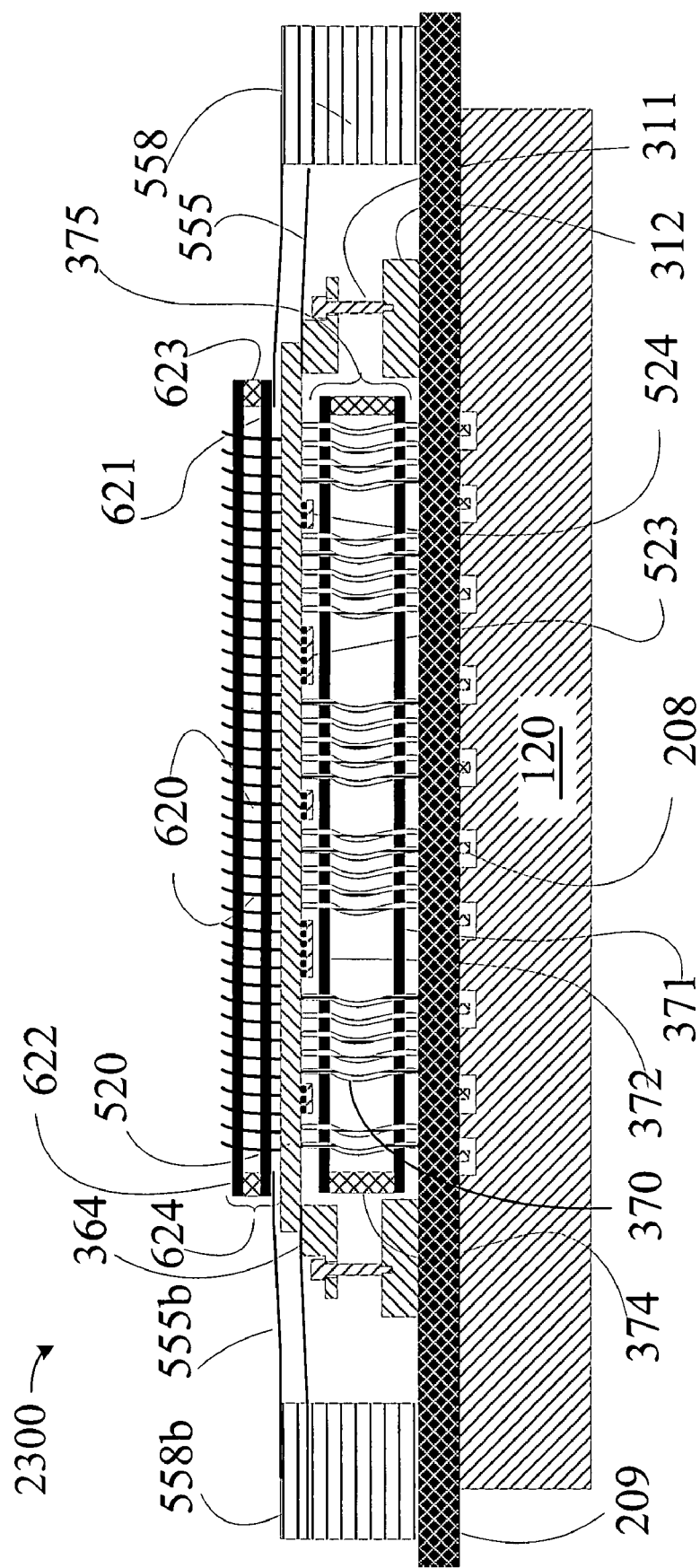
FIG. 23 shows an architecture for mounting switch or comparator ICs on the bottom of a structure using buckling beam type probes for both the DUT and the PCB interfaces.

Depending on the pad pitch and the total number of pads requiring contact on the DUT, different spring technology can be used as the DUT side springs 601 to achieve the best cost and performance. In applications where the total pad count is high, such as 15,000 pads and above, or when the pad pitch is small, such as 100 µm and below, the springs 601 would preferably be MEMS springs such as springs 605 shown in FIG. 18A or springs 610 shown in FIG. 18B. Theses MEMS springs can be photolithographically defined and processed as individual springs or groups of springs on wafers and can be fabricated by commercial sources such as by Microfabrica Inc. of Van Nuys, Calif. An application using these MEMS springs would be testing a full DRAM wafer. In applications where the pad count of the wafer being tested is lower, such as 10,000 pads or less, and the pad pitch is larger, such as 150 µm or greater, the springs would preferably be individual springs. An example of an architecture using individually assembled buckling beam type springs 620 is shown in FIG. 23. An application using the buckling beam type springs 620 would be a FLASH memory wafer testing or a testing of memory wafers that utilize Built In Self Test (BIST) interfaces. Using BIST minimizes the required test pins per die site.

Figure 14A:
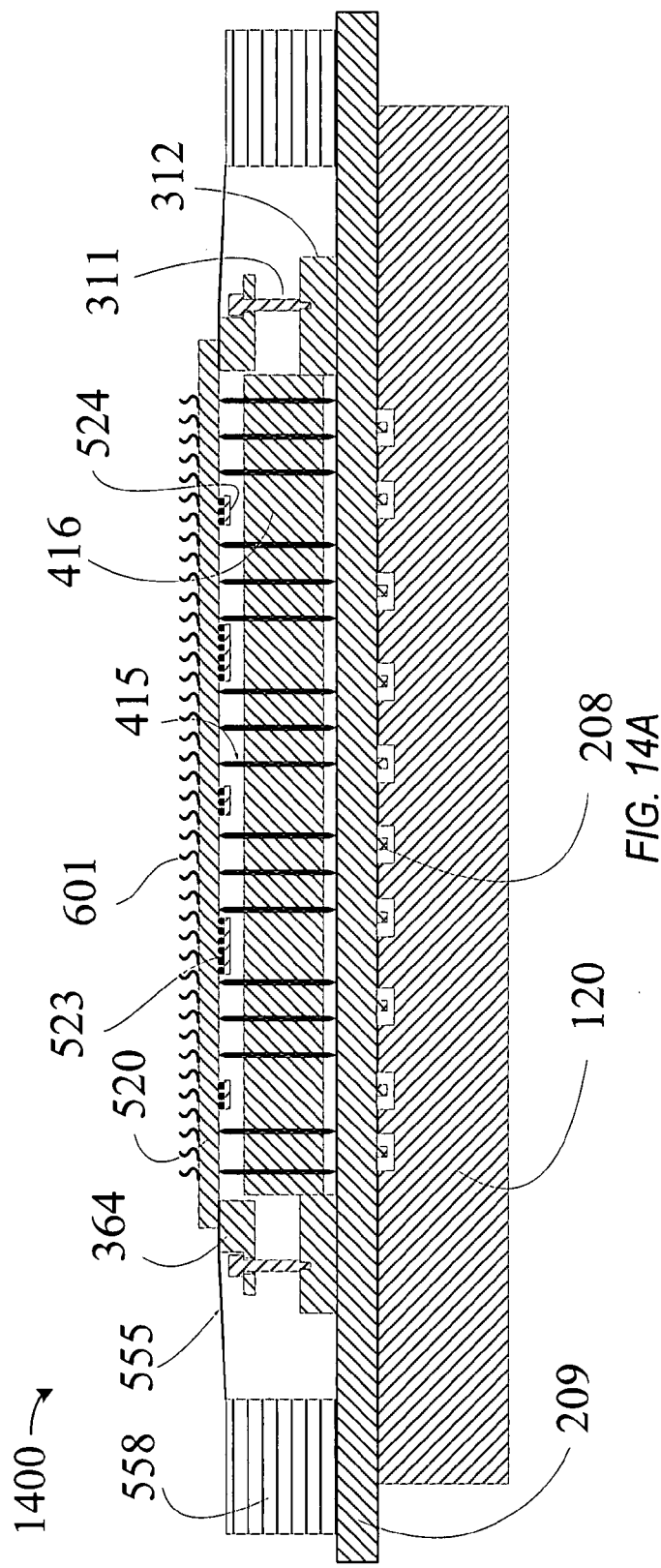
FIG. 14A shows an architecture for mounting switch or comparator ICs on the bottom of a structure using MEMS type probes.

On the tester side of the HDI 520 shown in FIG. 13, springs 417 will electrically connect metal pads on the tester side surface 526 of the HDI 520 to the electrical terminals of the probecard PCB 209. Springs 417 will typically be arranged in a regular array such as a 1 mm by 1 mm array. The pitch would preferably be chosen to match the PTH (Plated Through Hole) capability of PCB fabrication technology for the probecard which is typically 0.25 inch to 0.3 inch thick but could vary from 0.15 mm to 0.5 mm thick. Current PCB capability is around a 0.8 mm minimum pad pitch but the cost of the PCB is reduced if the pitch can be expanded to 1.2 mm or larger. The array arrangement can be grouped such that those supporting one die site will be grouped together. These groups of arrays will then be positioned to match the die site array pitch on the DUT wafer so that the X and Y pitch of each group will match the X and Y pitch of the die sites. This arrangement will allow the interconnect layout on the HDI substrate 520 to be a repeatable pattern thereby reducing design time for the HDI substrate 520. This, however, will add complexity to the design for the PCB 209. Deployment creates a tradeoff of design costs and availability of the respective interconnect routing resources. There are various spring technologies suitable for these tester side springs as shown in different embodiments of the architecture. System 1300 of FIG. 13 uses pogo pins 417 held in place by holes in a solid frame 418. FIG. 14A shows another system 1400 having pogo pins 415 held in frame 416. In the FIG. 14A, system 1400 has fewer tester pogo pins 415 balancing the force of the DUT pins 601 than does system 1300 of FIG. 13. Using few tester pogo pins would require pogo pin 415 of FIG. 14A to have a higher spring constant than pogo pin 417 of FIG. 13.

Another system 2300 using buckling beam or Cobra probes is shown in FIG. 23. These tester-side springs 370 are held together by mattress assembly 375 which typically will includes an HDI side template 372 and a PCB side template 371 held by a frame 374. To aid CTE (coefficient of thermal expansion) matching of the material properties on either side of this mattress assembly 375, it is desirable to use different materials to make the two templates 371 and 372. On the HDI side, a possible candidate for template 372 would be a resin board containing Kevlar fibers which has been available for PCB fabrication. Template 372 would match the CTE of HDI 520. On the PCB side, a resin board with glass fibers such as those used in the probecard PCB would be most suitable for template 371. Internal copper layers may also be needed in template 371 to achieve CTE matching to PCB 209 although the copper layers serve no electrical purposes. The initial leveling of HDI 520 and compression on springs 370 is set by adjusting screws 311 which can move plate 364 which is attached to HDI 520 relative to plate 312 which is attached to PCB 209.

Figure 15:
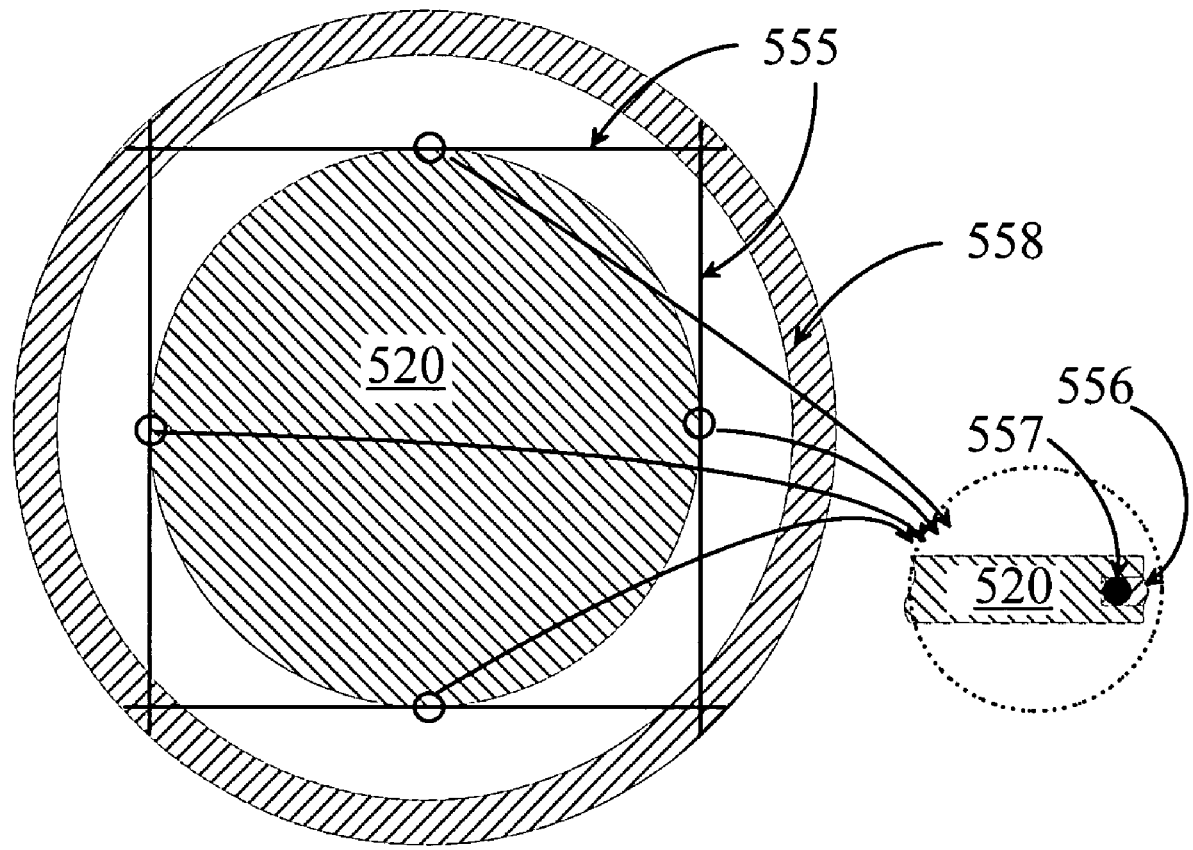
FIG. 15 shows a side attachment of a wire suspension to an HDI in a probecard.

HDI substrate 520 is held in place relative to the probecard PCB by a wire frame 555 such as shown in FIG. 15 for floating the HDI 520 for the memory testing applications of FIGS. 13, 14a and 23. A wire frame such as shown in FIG. 25B can also used for floating HDI 500 for logic testing applications with the architecture shown in FIG. 25A.

There are four key planarity tolerances that the spring system consisting of DUT springs and tester springs on either side of an HDI will need to compensate for in applying some of the new architectures disclosed herein. First is the planarity of the DUT wafer, which is typically flat to within a few microns. Chuck tilt can be minimized since the architecture uniformly pushes springs over the entire wafer surface. Second is the flatness of the HDI substrate. The starting substrate can be ground and lapped to around 25 microns of flatness. Various measures can be deployed to minimize stress in the interconnect layers, such as stress balancing between the films on the two sides and minimization of wafer level stress by elimination of thin film material across die site boundaries. Third is the flatness of the PCB surface. This PCB flatness can be largely achieved as shown in FIGS. 13, 14a and 23 by screwing the PCB 209 to a metal stiffener 120 to hold the PCB 209 flat in the area of the HDI substrate. Typical remaining planarity due to PCB thickness variation and pad plating uniformity is in the 20 to 80 µm range. Fourth is the change in flatness of the PCB due to the pressure and temperature change of the system during testing. This can be in the range of 10-50 µm. The system consisting of DUT side springs and tester side springs are preferably designed to balance the total force on the two sides of the HDI substrate so that the HDI is suspended by the springs in the Z direction. The preferable configuration is one where the HDI substrate would be just stiff enough to keep the local area flat despite the different locations of the DUT side springs and the tester side springs, but yet flexible enough over the entire surface of the wafer being tested so that the HDI substrate would flex under the spring forces and conform to the DUT wafer surface.

This configuration allows the DUT side springs 601 to have a very short compression and thus excellent electrical performance as well as ease of fabrication. Typically, a spring constant of 5 gmf over 20 µm compression is preferred for aluminum pads, but the spring constant could be in a range of 1 to 15 gmf for different pad materials and different compliance requirements. Compliance requirements could require up to 100 µm of compression.

The tester-side springs 415 or 417 will preferably have a spring constant such that tester side springs will balance the HDI side springs with a compression that is 2 to 3 times larger than the compliance that the DUT springs are required to overcome. This compliance requirement is determined primarily by the PCB flatness as described above. This compliance is also a function of the number of DUT side springs versus the number of tester side springs. If the ratio is 1:1, the spring constant of the tester side springs would then be 5 gmf over 2×-3× the PCB tolerance plus tolerance of spring length. If the ratio of springs is different, because there are fewer tester-side springs, then this spring constant of the tester side springs will need to be adjusted proportionally higher by the spring ratio.

This spring ratio can be a function of the number of DUT die sites being tested in parallel (simultaneously). The number of HDI tester-side signal springs 415 could be less than the number of DUT-side signals 601 needed to contact pads of the ICs being tested. For example, for some parallel die site testing applications, certain signals are shared (driven in parallel) to all die sites being tested. An example of shared signals would be the address inputs of DRAMs. An address line could be provided to the HDI 520 through one tester spring 415 and then the signal fanned out to 4-8 pads on other die each with their own individual DUT spring 601 as shown in FIG. 14A. Other applications can also increase signal sharing and increase the ratio of DUT-side to tester-side springs. For example, switch ICs 523 can be mounted on the tester side of the HDI substrate as shown in FIGS. 14A and 23. These switch ICs enable one tester channel to be switched between multiple die sites on the DUT wafer. This enables a tester to test more die sites at the same time without chuck movement. In the full wafer single touchdown case, this can be very helpful to enable the use of an existing tester with insufficient test channels to connect to every die terminal directly. This also reduces the cost of the probecard by reducing the number of springs between the HDI substrate 520 and the PCB 209.

Figure 7:
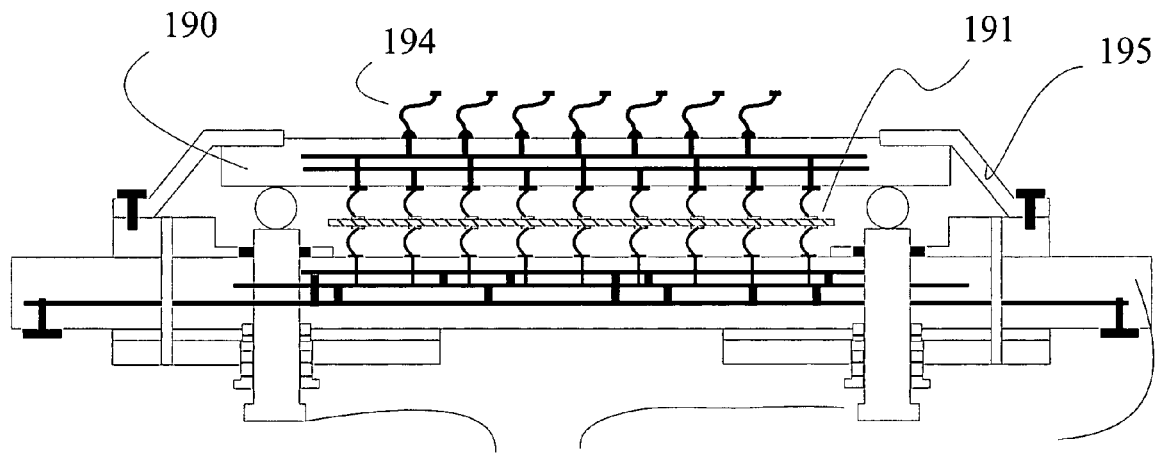
FIG. 7 shows a known MEMS-based memory probecard architecture based on an HDI co-fired ceramic.
Figure 8:
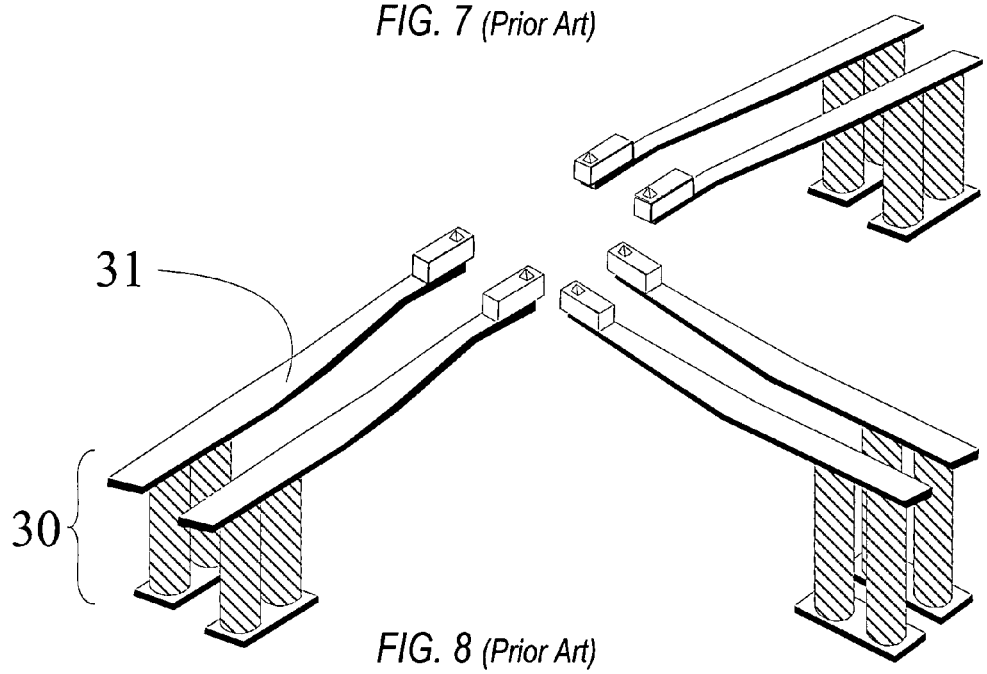
FIG. 8 shows a conventional MEMS spring suitable for used in the probecard architecture shown in FIG. 7.
Figure 9:
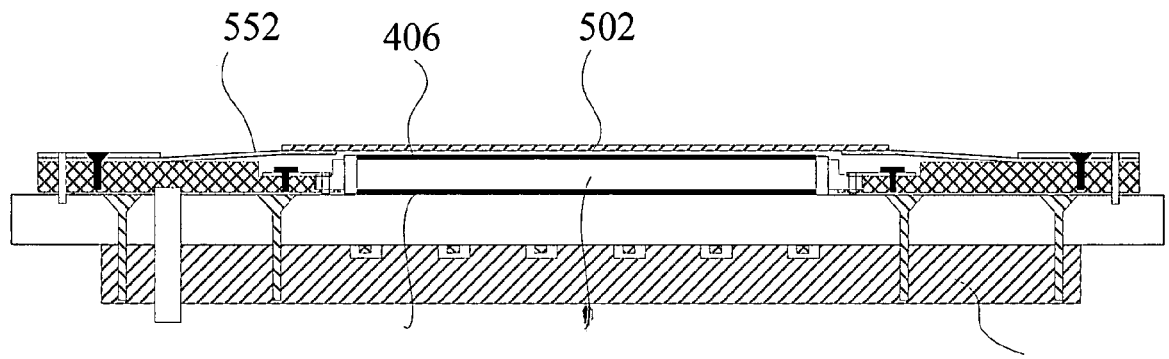
FIG. 9 shows a known MEMS-based memory probecard architecture with compliant membrane for holding an HDI.
Figure 17:
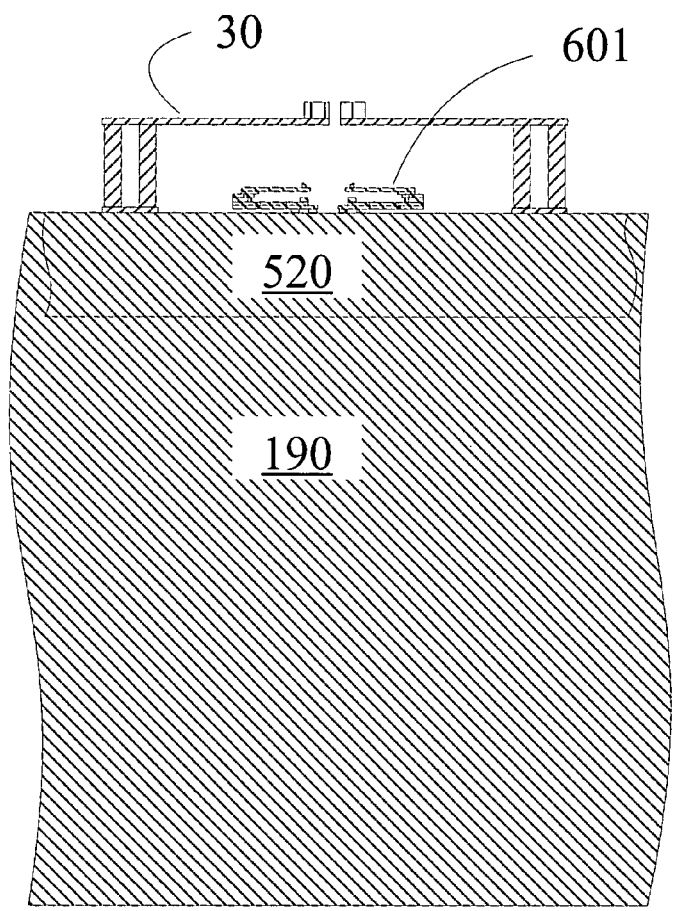
FIG. 17 illustrates the relative thickness of the substrate and short springs in accordance with an embodiment of the invention.

The memory testing embodiments do not try to isolate forces using a thick HDI and rigid stiffener frames like prior art. These embodiments balance the force of the shorter DUT-side IC contact spring with the force of the longer tester side springs to keep the thin HDI flat or otherwise in conformation with the DUT. The floating HDI dynamically compensates for the forces and stresses that the probecard encounters during testing. The probecard can thereby dynamically adjust to minimize distortion of the HDI that comes from mechanical flexing of the PCB, prober chuck or thermal expansion of the probecard during testing. The cycle time to manufacture the thinner HDI is generally 2 to 3 times shorter than a LTCC (Low Temperature Co-fired Ceramic) or traditional HTCC (High Temperature Co-fired Ceramic) substrates. The substrate is 3 to 6 times thinner which creates shorter paths to ICs or capacitors that are mounted on the backside of this thinner HDI thus enabling "at speed" full wafer testing. The thinner HDI can have 3 to 5 times lower cost than using the tradition ceramic HDIs. The new architecture provides the opportunity to share the test head design between wafer level burn-in testing applications and "at speed" functional testing. This sharing of components increases the volume of probe heads required and further reduces the cost for both applications. FIG. 17 compares the relative thickness of the HDI substrate 520 and the shorter MEMS spring 601 as used in some embodiments of the present invention to current MEMS spring 30 and conventional HDI substrate 190 such as shown in FIG. 7, which is currently used in a majority of the parallel memory wafer probing applications.

FIG. 15 shows the layout of the suspension wires 555 holding an HDI substrate 520 as in systems 1300 and 1400 of FIGS. 13 and 14A. The attachment of wires 555 to the perimeter edge of HDI substrate 520 restricts horizontal X-Y motion and rotation or theta movement of HDI substrate 520 but allows vertical or Z movement and tilt of HDI substrate 520. Wires 555 can be attached to the side of a 300 mm or slightly larger HDI substrate to eliminate the potential interference of this supporting wire with the DUT-side or tester-side springs. This is important since pads on an IC can extend to within 2 mm of the edge of a 300-mm wafer and the wire attachment for enabling the floating HDI cannot interfere with the placement of DUT-side springs. Alternately, wires 555 can be attached to the tester-side surface of HDI substrate 520 provided that the springs on the tester side are long enough to clear their template from wire attachment hardware.

Figure 10:
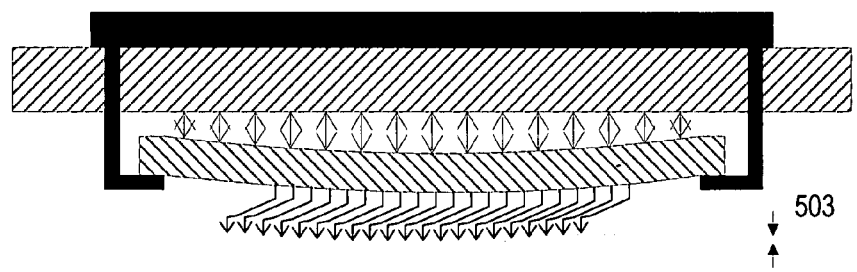
FIG. 10 shows an example of a convex bow in an HDI when the interposer springs are not populated near the edge of the HDI.

Wires 555 shown in FIG. 15 are stretched and suspended across an opening in a support ring 558, which is typically made of a stiff material such as stainless steel. Wires 555 themselves can also be stainless steel. Wires could alternatively be a thin ribbon made of metal or durable plastic such as Kapton. In the case where wires 555 are ribbons, the ribbons can be held horizontally parallel to the surface of the HDI substrate for attachment to the tester-side surface 526. FIG. 15 also shows a scheme for wire attachment where a grove 557 is provided on the edge of HDI substrate 520 for attachment of wire 555. Wire 555 fits into grove 557 and can be anchored in place using epoxy 556, solder, or other adhesive. In FIG. 15, HDI substrate 520 has four groves 557, i.e., one grove for each wire, for attachment of wires 555. The layout of the wire as shown in FIG. 15 provides the longest wire length possible within the gap between the support ring 558 and the HDI substrate 520. This is preferable in order to maximize the ratio between the tension force in the wire versus the vertical deflection force. It is preferable to minimize the vertical deflection force. Support ring 558, the wires 555 and the HDI substrate 520 with springs 601 or coupons 720 mounted on the DUT side and IC switches 523 or capacitors 524 mounted on the tester side 526, all together can form an assembled unit. However, some elements such as IC switches and capacitors may not be needed in some embodiments. Support ring 558 can include alignment features such as alignment holes to align the metal signal pads on the HDI 520 and to the metal signal pads on the PCB 209. It is preferred that the mounting level of the support ring 558 to be slightly closer to the PCB 209 than the HDI Substrate 520 as shown in FIGS. 13 and 14A, so that there is a slight force from wires 555 keeping HDI substrate 520, the tester-side springs 417 or 415, and the PCB 209 in contact. However, this force should not be high enough to cause the HDI substrate 520 to bow in the way that is similar to the bow 503 shown in FIG. 10.

FIG. 13 also shows retaining screws 325 in slot 104 held in place by bracket 326. The screws 325 can move HDI 520 by raising or lowering a shoulder or collar 365 which is attached to or supports HDI 520. These are shoulder screws used to retain the HDI in contact with the tester-side springs 417 and to the PCB 209 during shipment. FIG. 14A shows similar retaining screws 311 and attachment 364 to HDI 520 and attachment 312 to PCB 209 in an alternative arrangement.

Bypass capacitors 208 can be mounted on either side of the PCB 209. FIG. 13 shows capacitors 208 mounted on the far side of PCB 209. This is preferred when switching speeds do not require such elements closer to the DUT. Mounting capacitors 208 on the spring-side of PCB 209 will reduce the inductance path by the length of the PTH (plated through hole) barrels in the PCB 209. For even higher performance, capacitors 524 can be mounted on the tester-side surface 526 of the HDI substrate 520 as shown in FIG. 14A to eliminate the inductance of the tester-side springs between the capacitors and the DUT.

The stiffener 120 in FIG. 13 is mounted to the tester side surface of the PCB 209 using screws that mounts through the PCB 209. The attachment to stiffener 120 can bend PCB 209 to make PCB 209 flat, and stiffener 120 helps to keep PCB 209 flat during testing.

In the architectural examples of FIGS. 13, 14a and 23, the longer springs between the HDI and PCB have used buckling beam, cobra or pogo pins. A more traditional interposer such as 191 in FIG. 7 could be modified by changing the spring constant and placement of the springs to enable the dynamic balancing affect with the DUT interface springs.

FIG. 14A shows a variation of the architecture of FIG. 13 with the addition of ICs 523 mounted on the tester side of HDI substrate 520. ICs 523 can be devices to aid in the testing of the DUT devices. An example of such a device would be analog switches that allow the tester channels to be switched to multiple DUT ICs. Another example would be ICs that contain test logic such as data pattern generators and comparators that would exercise the DUT device at full speed and report only the error maps back to the tester. The advantage of using such devices 523 is that the interconnect trace path from ICs 523 to the DUT being tested does not have to go through the long tester side springs 415 nor the PCB 209. System 1400 can also use a much thinner HDI 520 than traditional HDI approaches (e.g., HDI substrate 190 of FIG. 17.). The combination of shorter electrical paths enables higher frequency operation during a test. This is especially beneficial as devices such as DDR3 that require signal frequencies upwards of 1 GHz. In this embodiment, the number of tester-side springs needed to connect to the tester may be further reduced. However, some springs 415 may be used just for mechanical support of HDI substrate 520 and not to carry electrical signal.

Figure 18A:
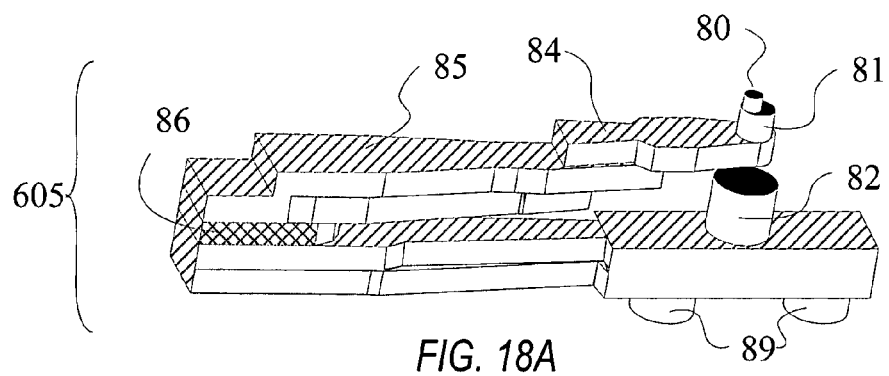
FIG. 18A shows an example of a low compliance MEMS based probe that can be soldered to an HDI substrate.
Figure 18B:
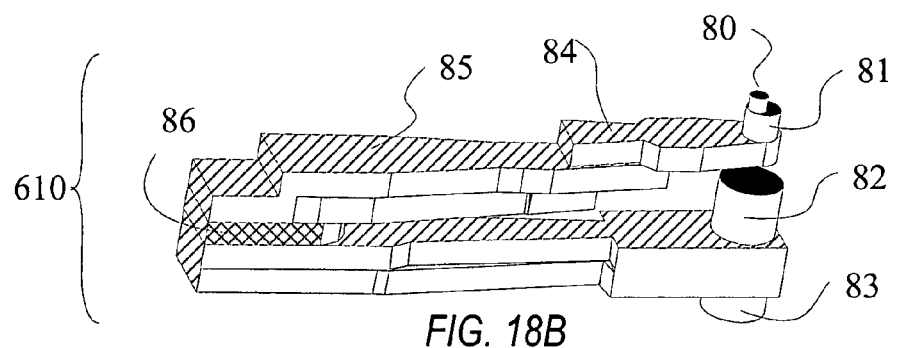
FIG. 18B shows an example of a low compliance MEMS based probe that is built into a replaceable coupon.

FIGS. 18A and 18B are examples of a low compliance MEMS springs 605 and 610 that can be built using process developed by Microfabrica, Inc. However, these springs 605 and 610 have nine fabrication layers versus the 32 fabrication layers needed for the higher compliance springs used in architectures with thick (8-11 mm) co-fired or LTCC HDI substrates. The partitioning of the compliance between two or more sets of springs enables the use of the shorter low-compliance springs. The low compliance spring also have improved electrical performance over the longer springs. Few fabrication layers reduce both the manufacturing cycle time and manufacturing cost. The fabrication process typically fabricates a large number of springs in or on a wafer, containing intertwined layers of nickel springs and sacrificial copper that tie all the springs together. The process can fabricate three-dimensional structures (probes) by repeatedly performing photolithographic, plating and lapping steps vertically on top of the prior layer. After fabrication, the wafer can be diced into blocks containing springs typically for a single die site. The spring block can be soldered down directly to an HDI substrate as a die site block before copper is etched away to leave the free standing springs. In DRAM applications each block would contain between 40 and 100 springs.

FIG. 18A shows a spring 605 that can be made using the above fabrication process. There are two solder attachment posts 89 in spring 605. Spring 605 has a C shape with the contact tip 80 over a raised tip 81 directly and over the attachment posts 89. Spring 605 provides low stress on the solder attachment points and also helps enable the use of a shorter spring since the stress is distributed over the entire loop of the C shape. The top lever arm is built using two layers 84 and 85 which are connected to the bottom lever arm through spacer 86. A stop 82 can be formed in the spring to limit the amount of overdrive the spring can experience so that spring 605 would not be damaged by over compression. Typically, the blocks for every die site will be soldered onto the HDI substrate first and then the entire assembly is immersed into a copper etchant to remove all the sacrificial copper in every block, thereby insolating each individual spring from each other.

The compliance partitioning architecture which enables the use of a very low compliance (short) probe interface to the DRAM IC pads also enables a new and simpler MEMS probe fabrication process. To fabricate a probe that can make a reliable electrical contact the probe must push or scrub away the oxides that form on aluminum pads while maintaining a minimum contact force of greater than 1 gram. Some higher current applications require even higher force to prevent the electrical contact over heating and causing the contact resistance to increase. The probe must apply these forces and have sufficient scrub or overdrive to ensure that the probe tip creates an electrically clean aluminum surface. The probe design must also compensate for the compliance needed to make up for the non-planarity in the probecard. For reaching the required force, higher compliance means the spring lever arm sees more stress and the stress must stay below the fracture point of the probe material or its spring constant will weaken and/or the spring will crack. To attain higher compliance requires either increasing the yield strength of the material or making the probe lever arm larger. Most MEMS probes are fabricated using a nickel based spring material and to switch to higher yield strength materials makes the probes significantly more difficult to fabricate. The scaling of IC pads to smaller sizes makes it impractical to make the probes larger in cross sectional area or length. The smaller compliance requirement of the compliance partitioning architecture enables shorter probes using a two lever arm counter balancing design which effectively distributes the material fracture stress over the combined length of the two lever arms which also contributes to shorter probes.

Another process to create nickel probes is a LIGA process. The LIGA process is a photolithographic process that uses X-Rays to create high-aspect-ratio structures. These structures create forms that can be electroplated to create individual springs. The springs are built as flat devices laying down on a silicon substrate. The springs are released from the substrate and can be soldered to a ceramic or other fine pitch substrate. The LIGA springs can be helical shaped or cantilever shaped springs. LIGA springs can be purchased commercially, for example, from Sumitomo Electric Industries in Japan.

Figure 19A:
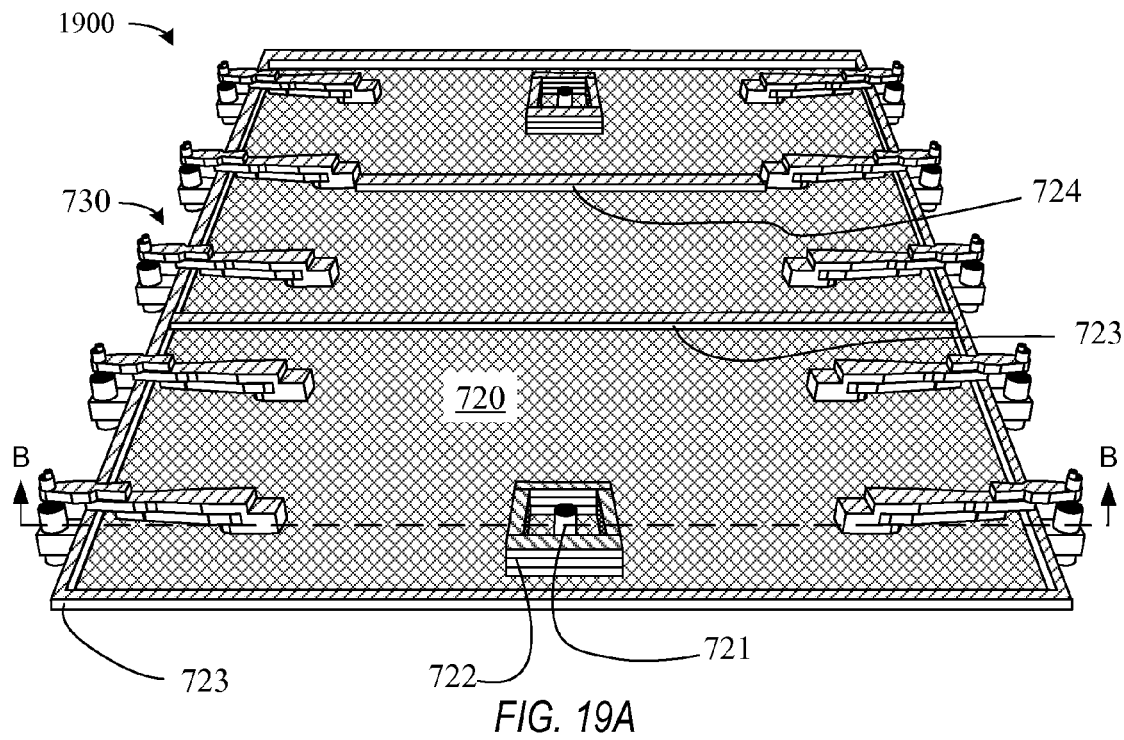
FIGS. 19A and 19B respectively show a perspective view and a cross-sectional view a coupon approach for field replaceable MEMS springs.
Figure 19B:
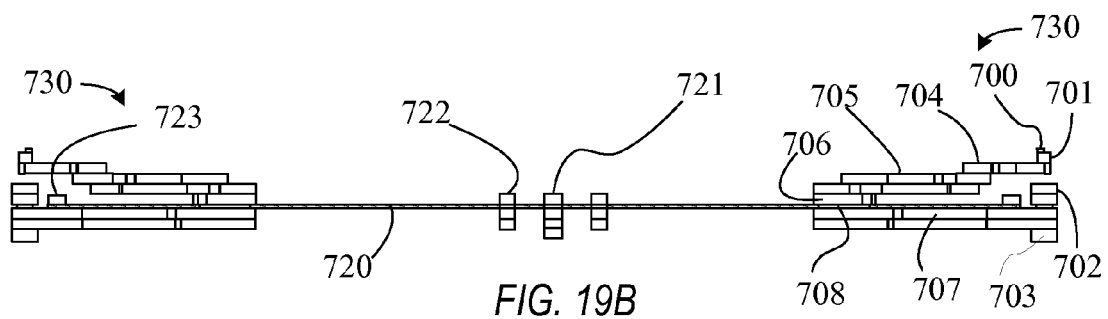

For DRAM memory applications, large array solutions (32 to 256 die sites in parallel) need MEMS springs to contact and escape from 40 to 100 electrical pads in each memory die site on the wafer. Most of the MEMS probes in these highly parallel probing arrays cannot be repaired at the customer's site. The compliance partitioning architecture enables a very low compliance (short) probe interface to the DRAM IC pads. This very low compliance design in turn enables the use of a replaceable MEMS based spring design. FIGS. 19A and 19B respectively show a perspective and a cross-sectional view of a coupon 1900 of floating probes covering either one die site or several die sites, e.g., several memory chips that are still part of a wafer. In coupon 1900, springs 730 have the same structure as spring 610 of FIG. 18B but are suspended by a flexible and insulating membrane 720 typically made of polyimide. Membrane 720 is preferably placed in the middle layers of the springs 730 as shown in FIG. 19B. Membrane 720 is kept in tension by a coupon frame 723 typically made from the same nickel material as springs 730 and fabricated as part of the spring building process through features in the lithography. Membrane 720 holds all the springs 730 and attachment points 708 in the proper positions relative to each other in the coupon.

The bottom spring arm 707 of each spring 730 has a single tip 703 that interfaces to a gold or other noble metal pad on the HDI substrate. Tip 703 is the equivalent of tip 83 in FIG. 18B. This tip 703 can be made of rhodium (Rh), Palladium Cobalt (PdCo) alloys or hard gold. The top spring arm of each spring 730 includes cantilevered sections 704 and 705 and has a shaped noble metal tip 700 of rhodium (Rh) or a Palladium Cobalt (PdCo) alloy which makes electrical contact to the IC pad under test. Tip 700 is attached to a post 701 which give tip 700 enough height to clear insulation layers around the IC pads to be contacted. Spring probes 730 are designed to simultaneously apply force to the cantilever arm sections 704 and 705 opposes lower arm 707 to counter balance their individual probing forces. This configuration eliminates the requirement for a strong rigid substrate with a solid spring anchor that is required by traditional MEMS probes. Without a solid anchor, traditional probes would break away from the substrate during testing. However, each spring 730 applies minimal torque on membrane 720 and the supporting HDI substrate at point 708. This enables the probes to vertically float and to dynamically compensate for any local flexing in the probecard. Membrane 720 and frame 723 maintain the relative x-y location of the probe tips 730. A stand-off 702 is created to limit the overdrive of lever arm consisting of 704 and 705 and 706 provides probe height for the lever arm.

Unlike existing probecards where individual MEMS springs are electrically and mechanically attached to a HDI or tile, the electrical contact pads on the HDI for the coupon interface do not require or have solder or conductive adhesives which need to be cleaned off before replacing probes as part of a repair process. The coupons 1900 of FIG. 19A can be tacked or pressure fit into place via the attachment points 721. The force from the DUT contact tip 700 will be transferred to the HDI contact tip 703 which will provide a reliable electrical contact to the gold pads on the HDI substrate. This means a damaged coupon can be removed and a new spare coupon replaced by customers at their test facilities without damaging electrical pads on the HDI substrate. This provides a MEMS-based repairable solution for large area memory testing.

Figure 19C:
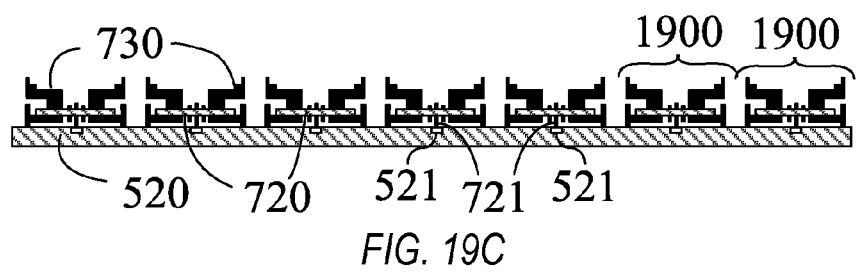
FIG. 19C shows replaceable coupons mounted on an HDI.

There are multiple ways to structure the attachment points 721 on the coupon membrane 720, which will typically be fabricated with the same nickel as the springs and coupon frame 723. FIGS. 19A and 19B show a stud 721 inside of a small frame 722. As shown in FIG. 19C, each stud 721 can be tacked to an alignment pad 521 on the HDI substrate 520 using adhesive, solder or brazed into position after the coupon 1900 has been aligned. For removal, a heat source such as laser can be used to heat up the stud 721 and to soften the solder or can be used to cut the attachment point to release the coupon 1900 from the HDI substrate. Unused, extra, attachment points can be placed on the coupon and on the HDI substrate to bond to fresh surfaces if needed when attaching new coupons. Alternately, the stud can be made longer and press fit into retaining holes in the HDI substrate. Another alternative for attachment is to build a post on the HDI substrate and create a nickel frame 722 that can be a press fit or clipped over the HDI post with a cap. For this alternative, any damaged probes on a die site would have the clipped portion of the frame cut away from the post using a laser. The coupon could then be removed without damaging the post and a new coupon pressed in place using the original HDI post.

FIG. 19C is an example of how coupons 1900 could be attached to substrate 520 rather than using individual springs 601 or sets of springs which are soldered to substrate 520. It is important to note that springs 730 can extend pass the edge of the coupon 1900. This eliminates the need to create a butt joint between tiles which creates inaccuracy in spring tip placements. The freedom to design a coupon 1900 that allows each spring 730 to extend beyond the active area of the coupon 1900 also simplifies repair of damaged coupons.

The replaceable die site coupon described above has several advantages over the solder method of attaching MEMS springs. The equipment needed to align and solder over a 300 mm wide area is expensive to build. The coupons are designed so that the tolerances needed to align the die sites are loose from a mechanical placement point of view. The alignment is set by the photolithographic processes that are used in building the HDI and the coupon. A very precise large area die site placement tool is not required for probe head assembly. The coupon design can be made such that some electrical routing 724 can be performed in the coupon 1900 and capacitors can be added for decoupling. The coupon configuration can be applied to other IC applications such as the burn-in and testing of individual ICs before mounting in a multi-die package and act as a socket for stacking ICs. Coupons can also be used as an interposers or springs between the HDI and the PCB. Traces on the coupon can connect one set of springs to another set of springs. This can be applied to connecting pads on one pitch to pads on another pitch to provide a fan-out function.

Figure 19D:
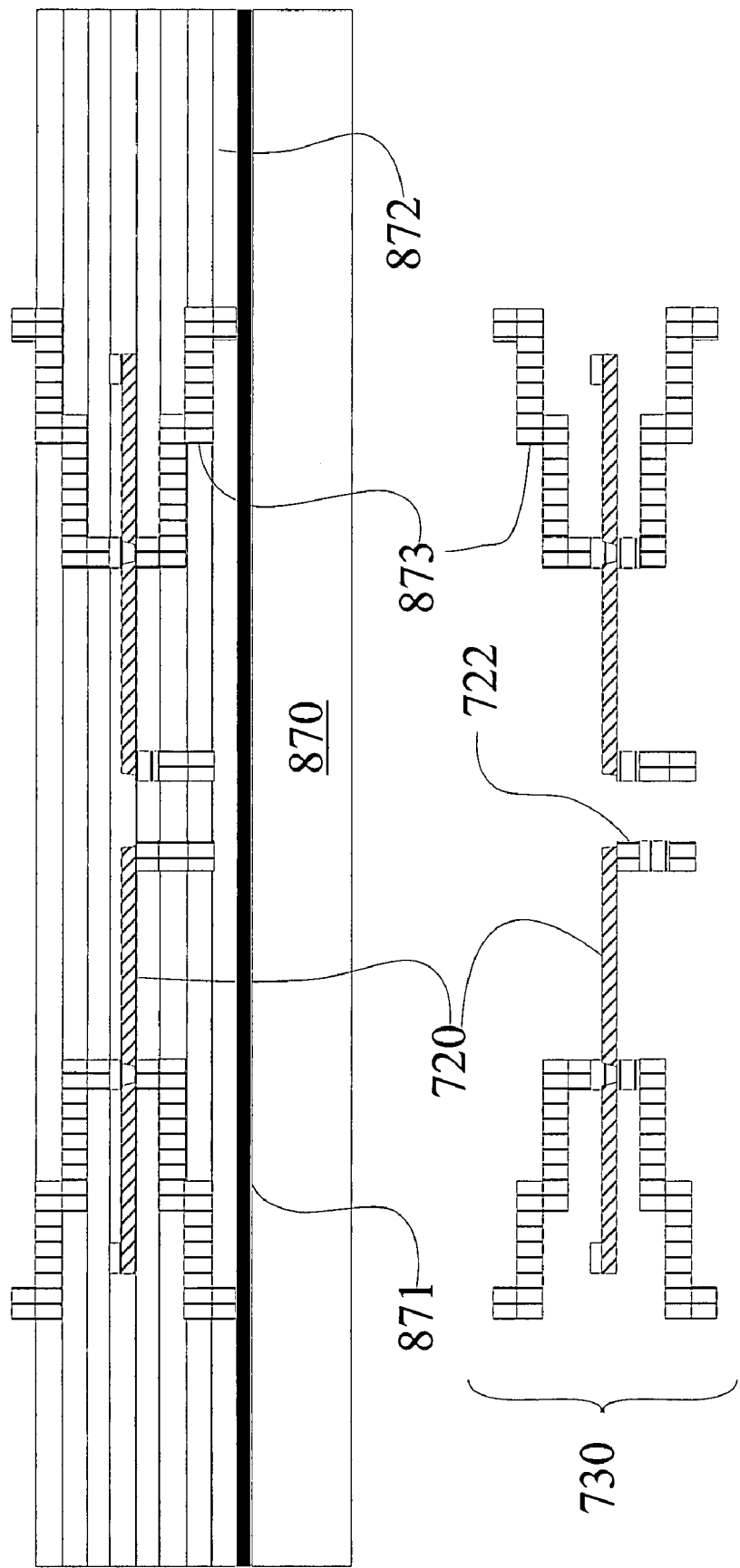
FIG. 19D illustrates a process of forming a block and etching away sacrificial material to create a coupon of springs.

A simple way to fabricate a coupon shown in FIG. 19D can be done by adding a polyimide spin and patterning step to the spring fabricating process such as the sequential plate and lap process used to create the multiple nickel layers of the spring. The process starts on a ceramic substrate 870 with a release layer 871. The repeated plate and lap steps of copper 872 and nickel 873 can be interrupted in the middle process after the lower spring layers are complete. A polyimide layer 720 is then applied and vias in the polyimide are patterned over the connection points between what will become the lower and upper springs. Then, titanium and copper can be sputtered onto the polyimide surface to form a seed layer. The titanium serves as an adhesion layer to the polyimide, or chromium can be used instead of titanium. The plating and lapping sequence is then resumed to complete the upper spring layers. In FIG. 19D, one copper layer 872 is labeled, even though the illustrated structure contains a total of eight layers of copper with inlaid nickel patterns. After etch away of the sacrificial copper layers 872, individual coupons 1900 will be formed with nickel springs 730 held in place by polyimide layer 720.

The low compliance probe for LCD testing can also be designed to solder down to a rigid HDI substrate or directly to a PCB as a coupon. The design of these springs can be simplified to need fewer fabrication layers because contacting noble metals require lower force (<0.2 grams) to make solid electrical contact. Noble metals do not have inherent oxides on the surface which reduces the force needed to make a reliable contact versus other pad materials like aluminum, copper or solder. One application for a simplified probe would be probing the metal under solder balls prior to their attachment. These pads are typically gold pads and are very planar compared to the height differences of solder balls. This spring/probe embodiment can be adapted to probe gold bumps on display driver ICs or ITO (Indium Tin Oxide) pads on displays.

Figure 20:
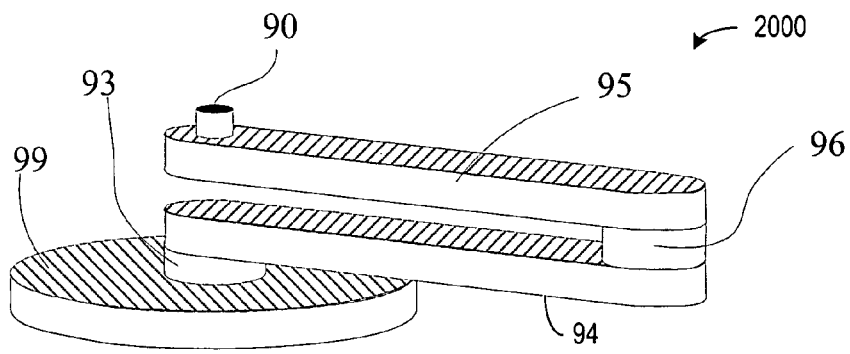
FIG. 20 shows a simplified spring design for contacting pads made of noble metals.

FIG. 20 is an example of a spring 2000 that can be soldered down to an HDI and used to probe UBM (Under Bump Metal) or other noble metals. The tip 90 of probe spring 2000 can be rhodium (Rh), Palladium Cobalt (PdCo) alloys or hard gold. The lever arms 94 and 95 can each be fabricated using one nickel or nickel alloy plating layer and separated by a layer 96. Layer 93 provides some additional height and pad 99 can have the bottom surface soldered to an HDI. Probe spring 2000 requires six nickel layers rather than the nine layers required for probing aluminum pads as shown in FIG. 18A. Since probing noble pad metals requires about 10% of the force required for probing aluminum, not only can the number of nickel layers needed for fabrication can be reduced but both the width and length of the lever arms 94 and 95 shown in FIG. 20 can be reduced by nearly a factor of two from the width and length required for aluminum testing.

Figure 11:
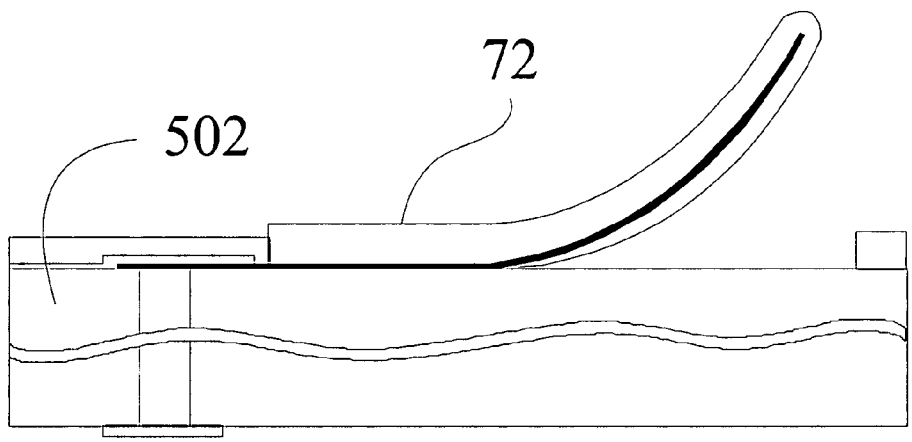
FIG. 11 shows a conventional MEMS spring that can be batch fabricated on the HDI used in the architecture shown in FIG. 9.
Figure 12:
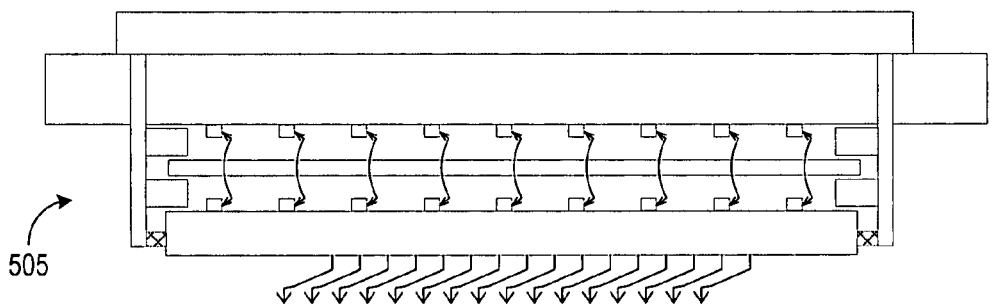
FIG. 12 shows a known example of an interposer design that limits the vertical force on an HDI.

This simplified probe can be adapted to the coupon approach and attached directly to the probecard's PCB for display driver and display testing applications. It enables a more vertical contact than other cantilever approaches such as illustrated in FIG. 11, which makes the design less sensitive to hitting the edge of the bump and bump defects or surface roughness which could lead to breaking the probe during testing. The coupon design can take advantage of the ability to run electrical traces inside of a coupon and fan-out them out from the very fine pitches needed for testing LCD drivers that has pad pitch below about 40 μm to a pitch that can interface to a PCB. This type of coupon design can have the tight pitch springs in the center of the coupon to contact the DUT die, and the wider pitch springs around the edges of the coupon. A nonconductive ring can be used to press the outer springs onto a probecard PCB while a raised platform on the PCB will push the center springs against the DUT die. This raised center platform needs to be made high enough to provide clearance from the DUT wafer to the first nonconductive ring. This coupon approach provides a simple and inexpensive solution compared to conventional probe cantilever solutions being used for testing display drivers.

Another approach for fabricating a low compliance spring consist of deforming a flexible membrane and then locking in the deformation with nickel or nickel alloy plating to create a spring lever arm. The flow for fabricating this spring with key process cross sections is shown in FIGS. 21A to 21D. The process flow of FIGS. 21A to 21D starts with first depositing a release layer 815 of a material such as titanium (Ti) or chromium (Cr) as an adhesion layer plus copper (Cu) which serves as a plating seed layer as well as a release layer on a suitable substrate 810 such as silicon wafer. Photoresist is then deposited and patterned. The openings in the photoresist layer are then plated with gold (Au) and nickel (Ni) to define contact pads 820.

Figure 21A:
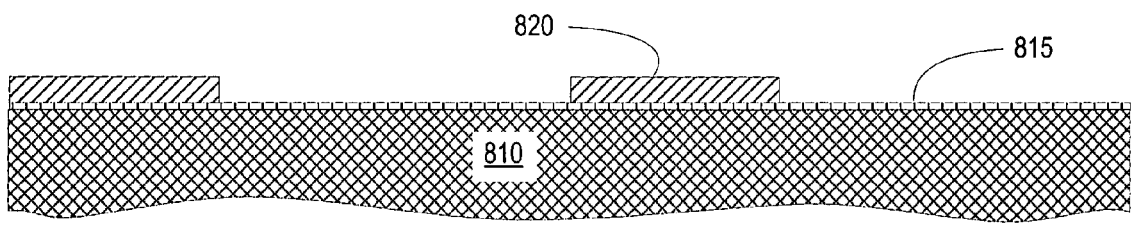
FIGS. 21A, 21B, 21C, and 21D show process steps for defining a spring shape on a thin membrane.
Figure 21B:
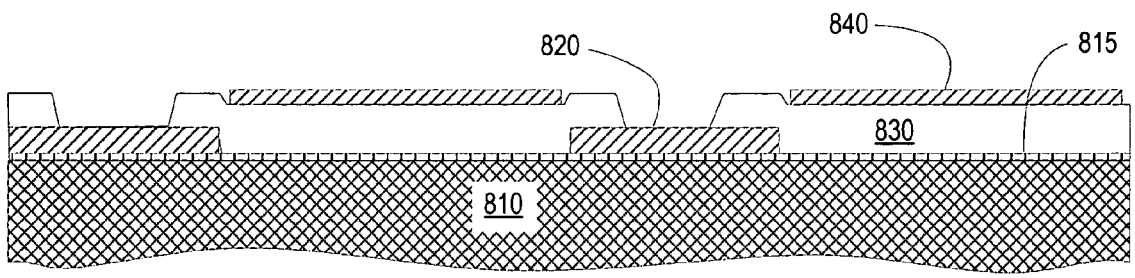

A compliant membrane layer 830 about 5 to 20 microns thick is spun down and vias are etched down to pads 820 as shown in FIG. 21B. A release layer 840 of titanium (Ti) or chromium (Cr) is deposited and patterned over areas where springs need to be released as described further below. It is preferred that the material in release layer 840 be different from the material used in underlying release layer sandwich 815.

Figure 21C:
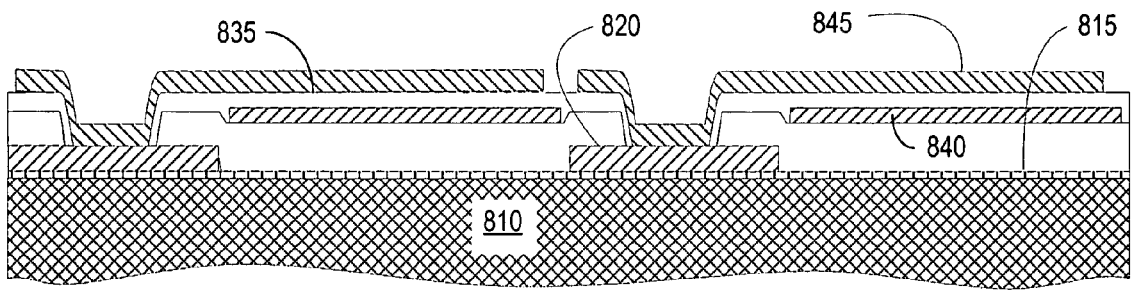

A thin compliant membrane layer 835 with a thickness of 2 to 10 microns of a material such as polyimide is then deposited and patterned with vias to the previous defined contact pads 820 and covering areas under each spring site as shown in FIG. 21C. A final layer 845 of thin 500 Å to 2000 Å copper is then deposited and patterned using a photolithographic process to define the shape of the springs over the spring sites 840 and the previous vias over pads 820. Layer 845 controls shapes that will later be plated with nickel or a nickel alloy to create springs. Various shapes of springs can be used for this process ranging from straight cantilevered springs, straight spring with support on both ends and other shaped springs. An example of a spiral shaped spring 845 is showed in FIG. 22.

Figure 21D:
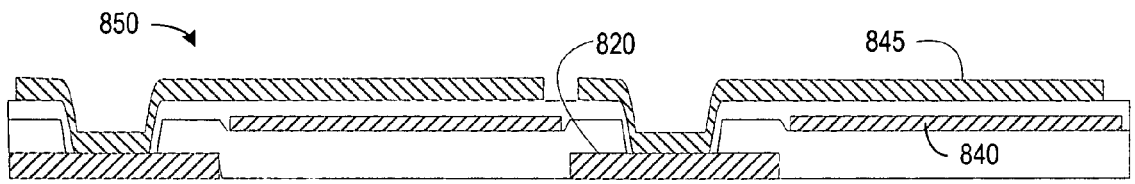

A support ring (not shown) made of a material such as molybdenum that has similar Coefficient of Thermal Expansion (CTE) to silicon is then attached to the edge of the silicon wafer 810 over the polyimide 830 or 835 using a suitable adhesive such as B-stage adhesive sheets. The release layer 815 is then etched away to release the polyimide and patterned metal films from the wafer as shown in FIG. 21D. The result is a membrane 850. The features on membrane 850 will stay in place since the attached support ring will keep membrane 850 in tension.

Figure 21E:
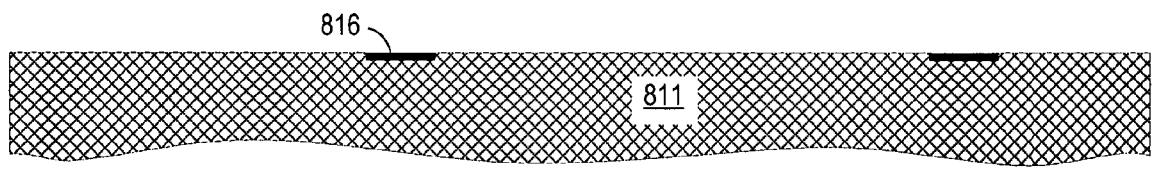
FIGS. 21E, 21F, 21G, 21H, 21I, and 21J show a process for forming and plating to create membrane springs.
Figure 21F:
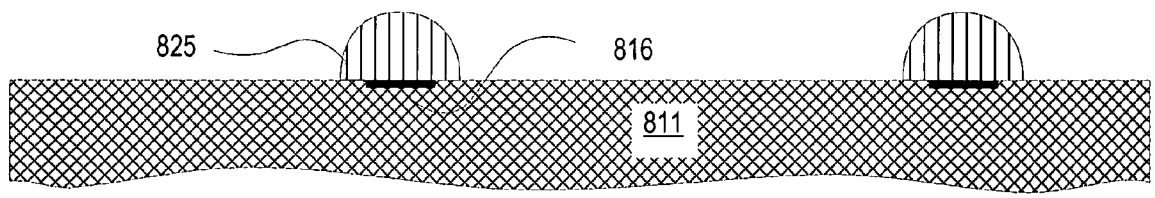

Separately, as shown in FIG. 21E, a forming tool is fabricated on a flat substrate 811 of a material such as glass, quartz or ceramic. Tin-Nickel-Gold (TiNiAu) is deposited on substrate 811, and metal pads 816 with a tightly controlled diameter are created through photolithographic and etching processes. As shown in FIG. 21F, solder bumps 825 are then formed on pad 816 with very tight control of the bump size, shape and height using any known process used for traditional BGA die attach. Solder bumps 825 are formed in locations matching areas of membrane 850 where springs are going to be created. Since the height of the bump is critical to the amount of deformation that membrane 850 will see prior to plating of spring material, the heights of bumps 824 must be tightly controlled. If the bump 825 heights are too large, a coining process can be used to ensure they are leveled to meet the height requirement. It is preferred that a relatively hard solder be used such as tin-gold. Alternately, other methods for creating such a forming tool can be used, such as plating tall copper or nickel posts onto substrate 811.

Figure 21G:
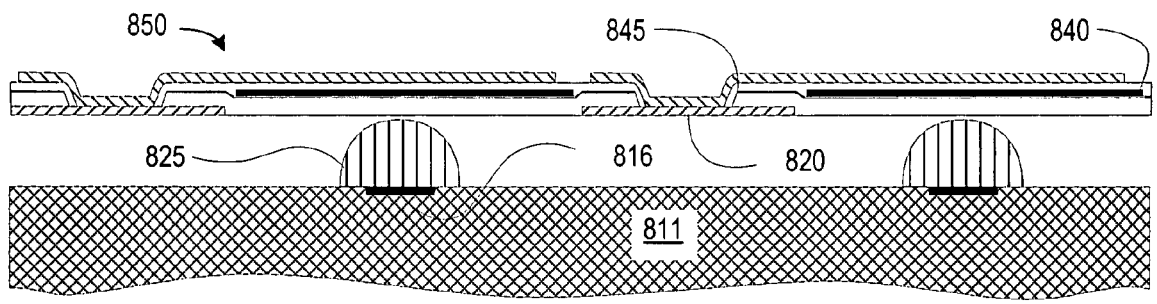
Figure 21H:
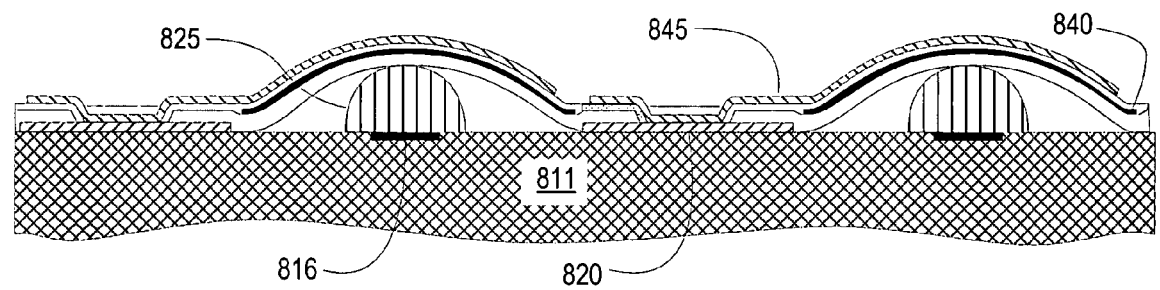
Figure 21I:
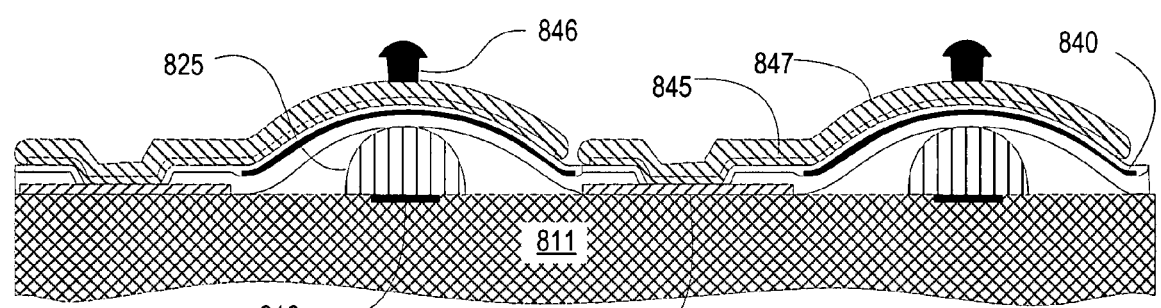

The membrane 850 is aligned to bumps 825 on the bumped substrate 811 as shown in FIG. 21G, and vacuum is used to make the membrane conform to the shape of bumps 825 on the substrate 811 as shown in FIG. 21H. This causes the spring structures 845 on the membrane to take on a three-dimensional shape. In practice, bumped substrate 811 would be used as part of the plating fixture for membrane 850. This fixture would provide an electrical contact to the seed layer 815 as well as vacuum through bumped substrate 811 to make membrane 850 conform to the bump shapes. The patterned spring structures 845 on deformed substrate 850 are plated with a nickel or nickel alloy to create springs 847 having a thickness and composition that provides the desired spring constant. Springs 847 retain the three-dimensional profile of membrane 850 before membrane 850 is disengaged from the bumped substrate. Contact tips 846 can then be defined on springs 847 using photoresist over the peak of the nickel springs. It is preferred to use a plateable photoresist due to the high profile of the deformed membrane shape. The plateable photoresist will provide a more uniform resist thickness up to 10 μm compared to traditional photoresist. Probe tips 846 are then plated into these openings using materials that wear well during testing like Rhodium (Rh) or Palladium Cobalt (PdCo) alloys.

Figure 21J:
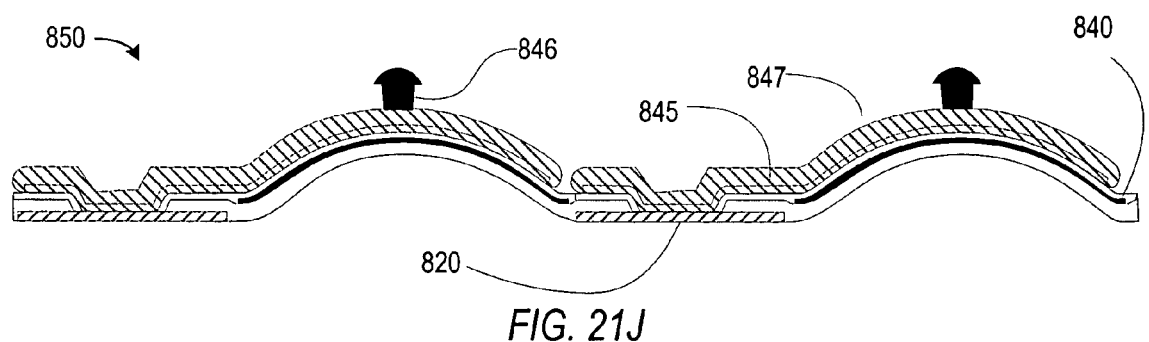

The forming tool consisting of substrate 811 with bumps 825 can be reused for multiple membranes of the same spring layout after the finished membrane 850 is released from this bumped substrate as shown in FIG. 21J.

Since the polyimide film is cured at around 400 degree C., membrane 850 is kept in tension throughout the temperature range of the above process which does not go higher than 150 degree C. This keeps the springs suspended on the membrane 850 to stay in position relative to each other as well as to alignment features on the ring where their relative movement as the temperature varies will be limited by the thermal expansion of the molybdenum ring. Since molybdenum has a very similar CTE to the silicon in a DUT wafer, this embodiment keeps the springs in positions that will track their respective pads on the DUT wafer irrespective of test temperature. The purpose of the second release layer 840 is to allow the first polyimide layer to return to a flat position after spring plating so that the variation in the tension in the first polyimide film is minimized. The second polyimide film 835 serves to electrically isolate the spring seed metal 845 from the second release layer 840 so that area not under the metal 845 will not plate. It is an option to skip the second polyimide layer 835 if the second release layer 840 is placed only under spring seed metal 845. The drawback of this is that the plated metal will grow both vertically as well as laterally around the edges of the seed metal 845 and pinch off etchant access to the release metal 840 making this release operation less controllable.

After this membrane 850 is removed from the forming tool after the previous plating steps, the second release layer is etched to allow the first polyimide membrane layer to return to a flat shape. The springs will retain the deformed shape since the plated nickel will keep it in that shape.

Figure 21K:
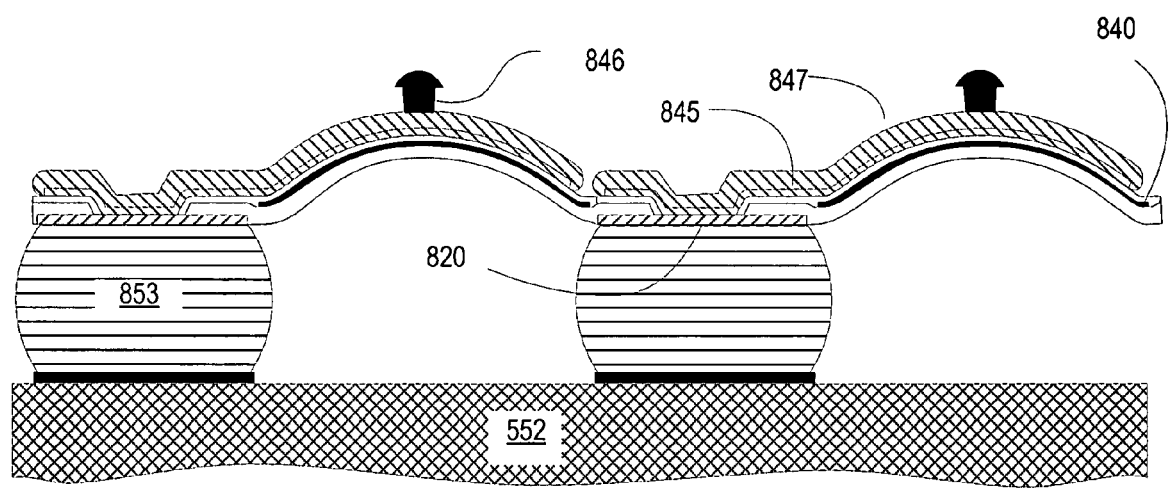
FIG. 21K shows an attachment of the membrane springs to the HDI using solder balls.

The finished membrane 850 can be used as a fine pitch interposer by attaching membrane 850 using solder balls 853 to a HDI 552 substrate to form a probecard. This soldering can be done using conventional ball grid array solder balls 853 as shown in FIG. 21K, or using a more controlled lamination process to ensure planarity of the finished structure.

Figure 21L:
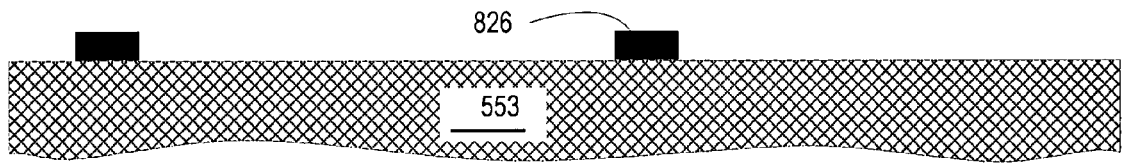
FIGS. 21L, 21M, 21N, and 21O shows a lamination process for attaching membrane springs to an HDI.
Figure 21M:
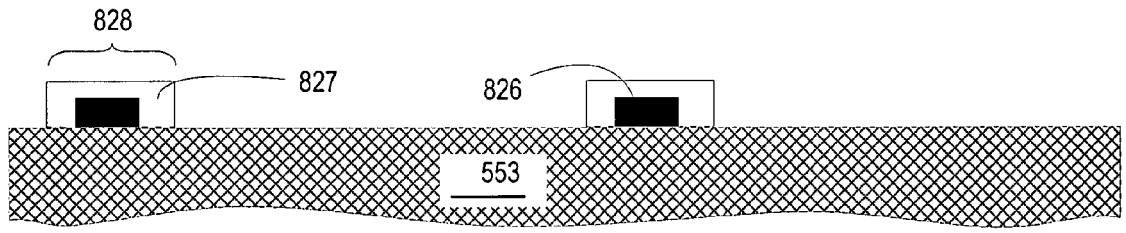
Figure 21N:
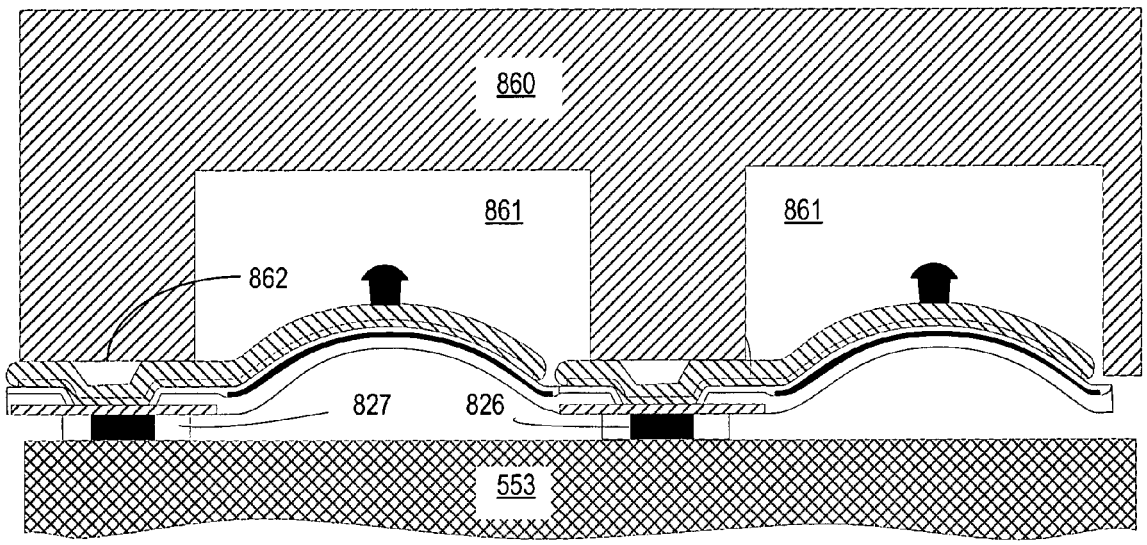
Figure 21O:
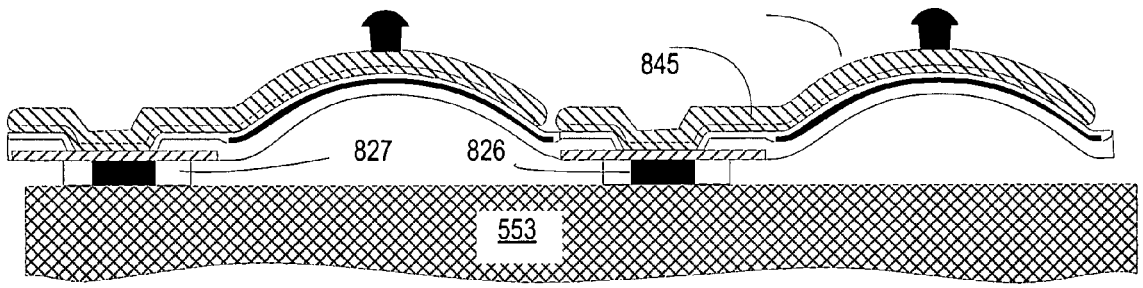
Figure 22:
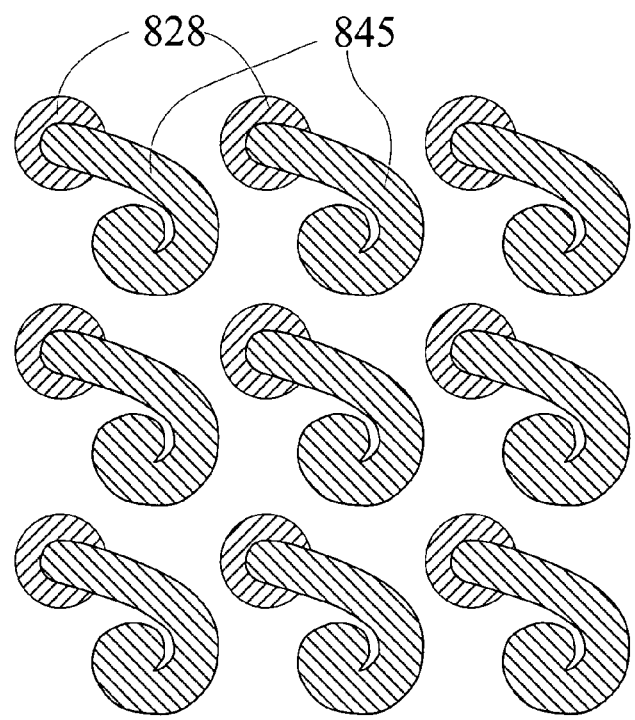
FIG. 22 shows the top view of a membrane spring layout before plating on the membrane.

A laminate process is illustrated in FIGS. 21L to 21O. This attachment can be achieved by processing tall bumps 826 of a semi soft material such as copper on the connection pads on an interconnect substrate 553 as shown in FIG. 21L. These bumps 826 can then be plated as shown in FIG. 21M with a solder 827, preferably a high temperature solder such as tin-gold to form plated bumps 828. Membrane 850 is then held in a fixture 860 to ensure that membrane 850 stays flat as shown in FIG. 21N. Fixture 860 can be made of quartz with cavities 861 etched for the springs to fit into while the solder pad positions are firmly supported by the quartz surface. This way, the quartz surface 862 which can be made to be very flat can be used to push the pad portion of each spring against the plated bumps 828 of the interconnected substrate and apply pressure and heat to achieve a secure joint while keeping all the springs planar. The tin-gold solder 827 will flow around the copper bump 826 to provide adhesion after cool down. The copper bump 826 can also be slightly crushed to overcome non-planarity in the interconnect substrate. FIG. 21O shows the HDI substrate 553 with attached springs after removal of fixture 860. A top view of a layout of the springs 845 with a curved shape to create a long lever arm is shown in FIG. 22. A spring shaped in a curved beam and supported on both ends can be created by this scheme by slightly extending the end not connected to the via over the pad of the adjacent spring, but electrically isolated from the neighbor spring. This greatly reduces the moment stress exerted onto the soldered contact point 827.

Another embodiment of the architecture is described that enables the use of short Cobra or buckling beam type probes as the short low compliance probe rather than the two levered arm approach that is needed for higher pad densities that may be required for devices such as DRAMs. This embodiment is well suited to full wafer probecard for lower performance Flash memory testing. Flash die are typically much larger than DRAM die, so the density of probes needing to escape the die area is much smaller than for a DRAM. In many Flash memory applications, only 8 to 32 pads need to be contacted for testing. Flash die typically are tested at less than 50 MHz while future DRAMs may require testing at 1066 MHz. FIG. 23 shows a system 2300 as an illustrative example of this architecture. System 2300 includes short buckling beam probes 620 that can be fabricated using industry standard Beryllium Copper (BeCu) or Paliney 7 materials. Alternatively, spring probes 620 can be nickel or nickel alloys such as the springs provided by Microfabrica or Sumitomo Electric Industries when tighter pitches or shorter probes are required. The short Cobras/buckling beam probes are aligned in a temperature compensated frame 624. The DUT side 622 of frame 624 can be made of a material that closely tracks the temperature of silicon and the test-side 621 of the frame 624 can track the CTE of HDI 520. This Cobra/buckling beam probe can be designed to be repaired in the field.

By having the frame side 622 CTE matched to silicon to enable hot and cold testing with the same test head. Frame templates 621 and 622 are held in place by member 623 which is allowed to bend to compensate for the thermal expansion differences between 621 and 622. The frame can be floated on wire 555b to ring 558b using support based on a configuration like the one shown in FIG. 25B. Like the DRAM applications, this architecture also enables the mounting of by-pass capacitors 524, resistors 524 and ICs 523 on the back side of the HDI 520 to support testing Flash memory devices. This capability of mounting active IC devices can reduce the number of interface connections to the PCB 209 that then interfaces to the IC tester for signals, power and grounds, and further reduce the total test cost.

Figure 24:
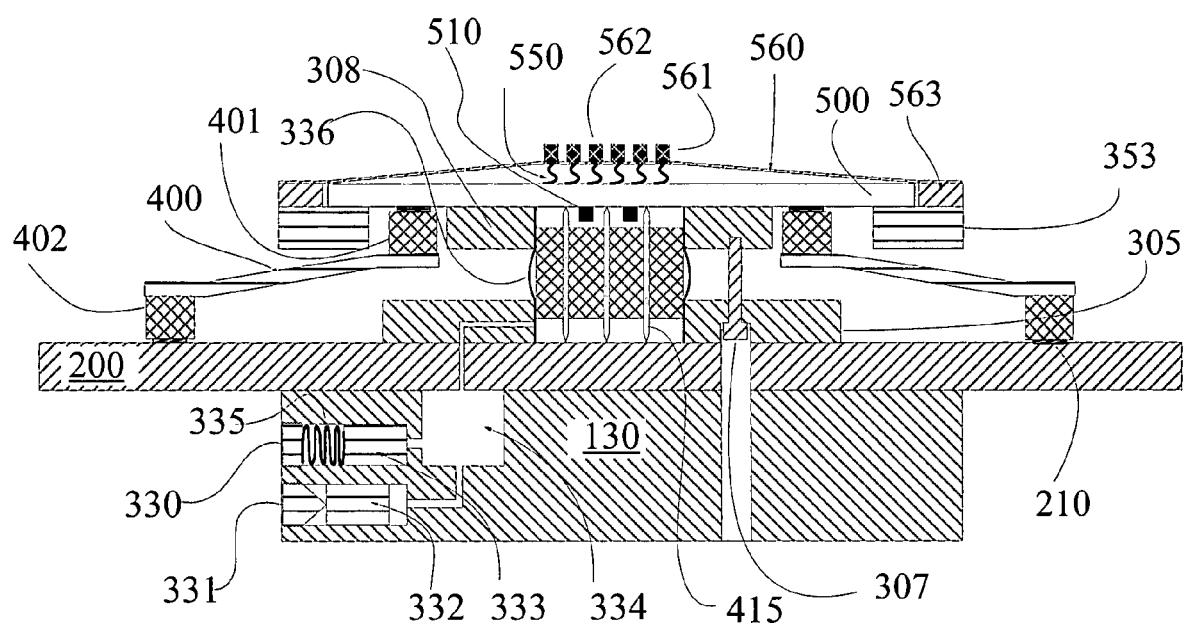
FIG. 24 shows a hydraulic contactor system with a thin flexible membrane of tips interfacing to the shorter compliance probes.

Another embodiment of the invention, shown in FIG. 24 uses a hydraulic contactor system to allow for specific compensation to local flexing and non-planarity due to groupings of probes that can not be fully balanced by adjusting the spring constant of the longer tester-side probes. This approach could be applied when the short springs are grouped closely together in one area of a die but relatively far away from the next grouping of probes and end up flexing the HDI to the extent that probe positions are no longer centered on the IC pads. An example of this would be a Built-in Self Test (BIST) application that may only use 6-12 pads and then confines these pads to a small area of the IC die for a full wafer memory testing application. As shown in FIG. 24, instead of requiring the tester side springs 415 to provide equal and balanced forces for the DUT-side springs 550, a hydraulic system is used to provide this force. A membrane bellow 336 surrounds the tester side springs 415 and is sealed to the substrate ring 308 and the PCB ring 305. A non-conductive fluid 334 floods the chamber created by the bellow 336 and the two rings 308 and 305. This fluid is maintained at a precise pressure required to balance the DUT side spring force. This is obtained by the spring loaded plunger 333 which has a spring 335 and an adjustment screw 330 that provides course pressure adjustment, and a fine pressure adjustment plunger 332 with an adjustment screw 331. Theses hydraulic controls can be built into stiffener 130. Several retaining shoulder screws 307 act against the preload pressure of the system to allow the substrate 500 to be set at a plane parallel to the surface of PCB 200. As the DUT-side springs 550 are compressed against the DUT wafer, the shoulder screws 307 lift off from the hole shoulder in ring 305 when the spring pressure from the DUT exceeds the preload pressure and spring 335 compresses as liquid 334 is channeled into the chamber of plunger 333. The liquid can also be temperature controlled to aid in CTE matching to the wafer under test and capacitors like capacitors 510 can be provided.

Figure 5:
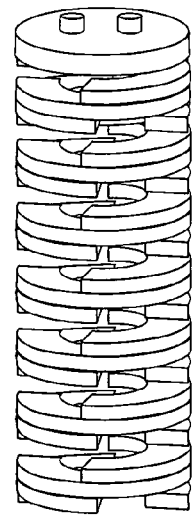
FIG. 5 shows a known MEMS spring that can be used in dense arrays of logic testing.
Figure 6:
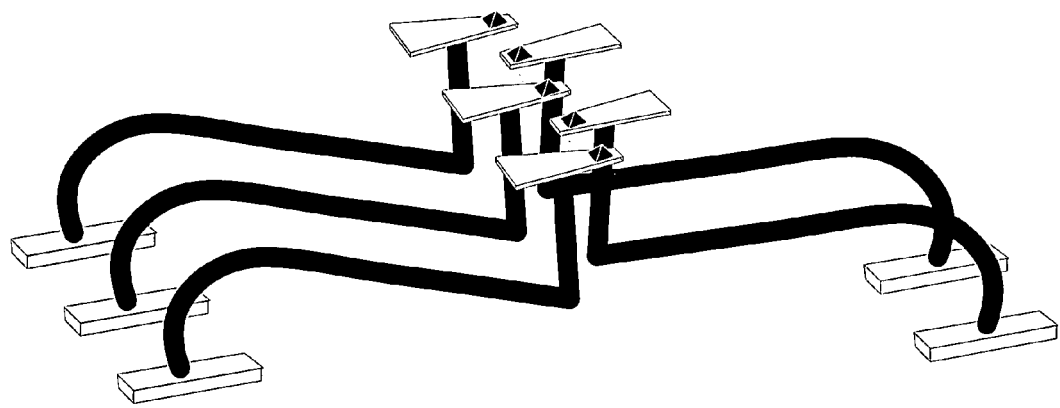
FIG. 6 shows conventional wire bond probes.
Figure 25A:
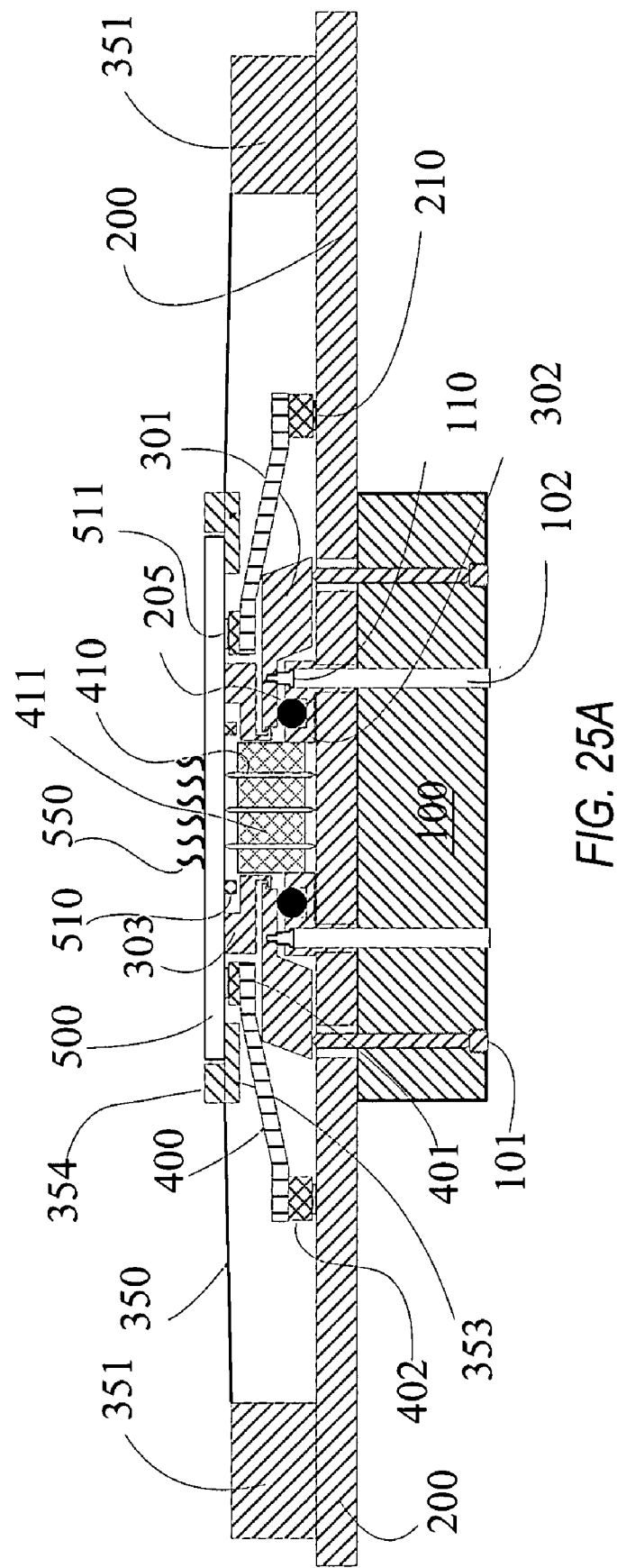
FIG. 25A shows an array probecard with pogo pins for power and ground distribution to a HDI substrate for microprocessors using MEMS probes.
Figure 25B:
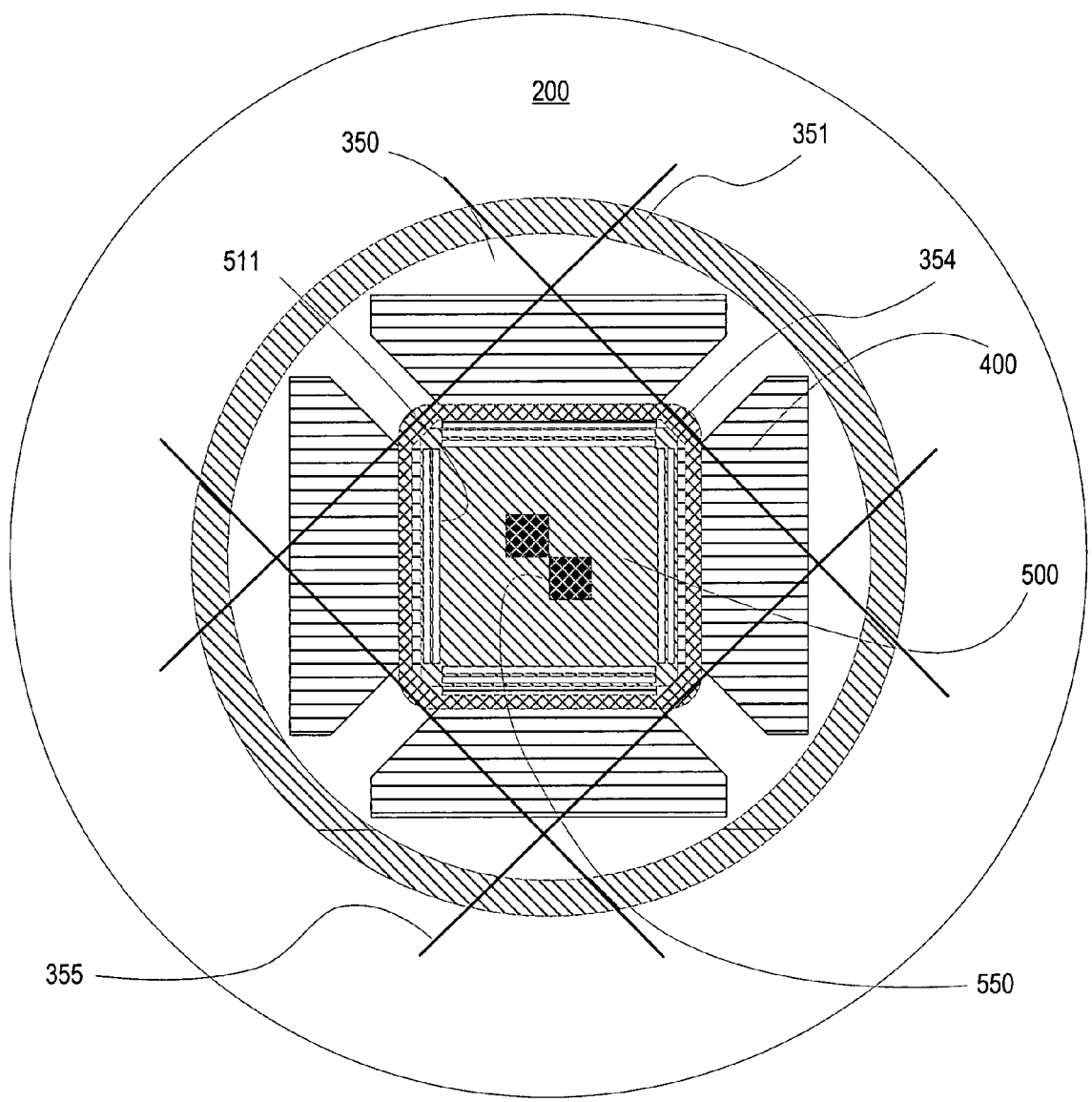
FIG. 25B shows the top view of a wire suspension attachment for holding an array probe head.
Figure 25C:
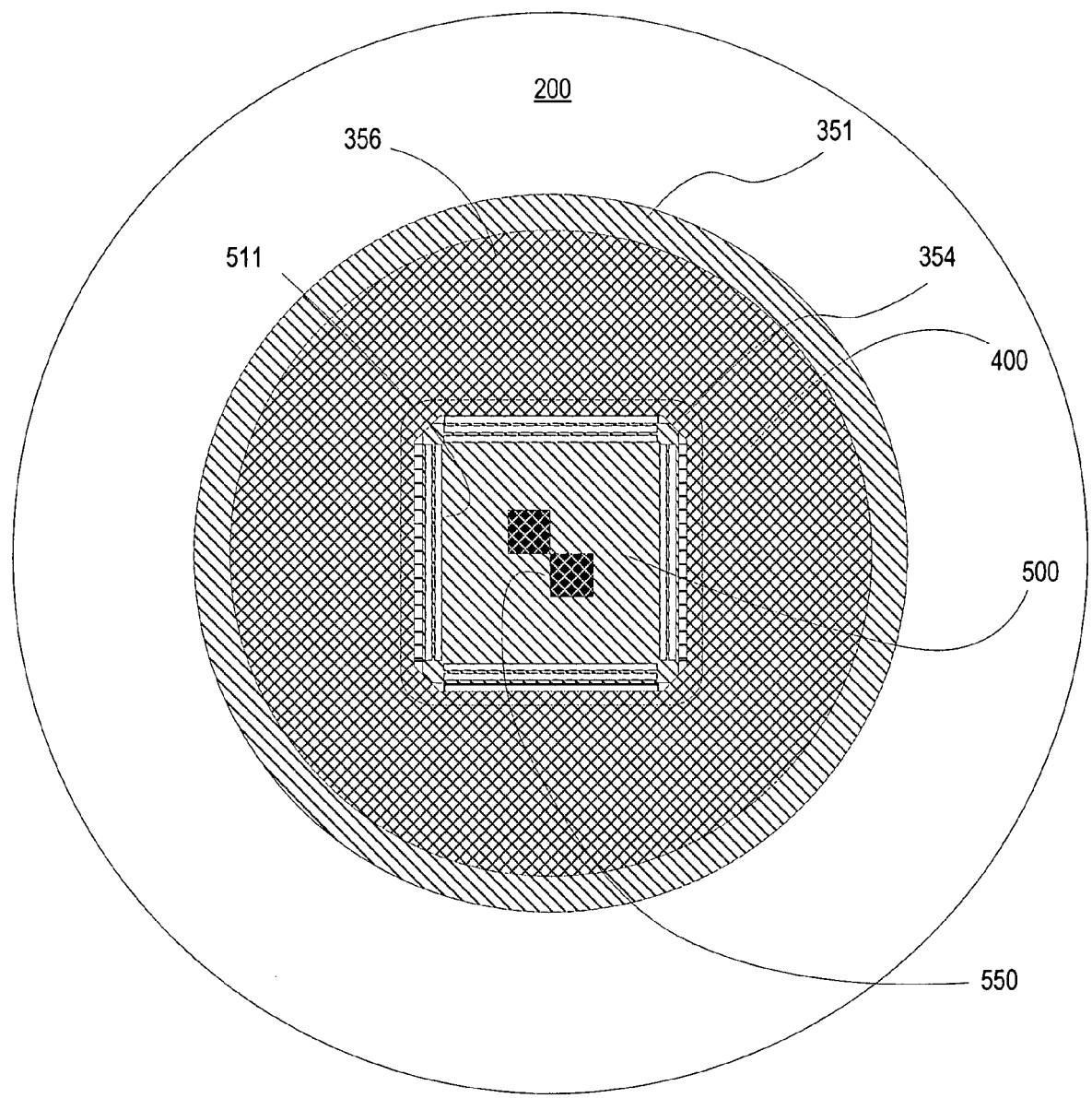
FIG. 25C shows the top view of a membrane suspension for holding the array probe head.
Figure 25D:
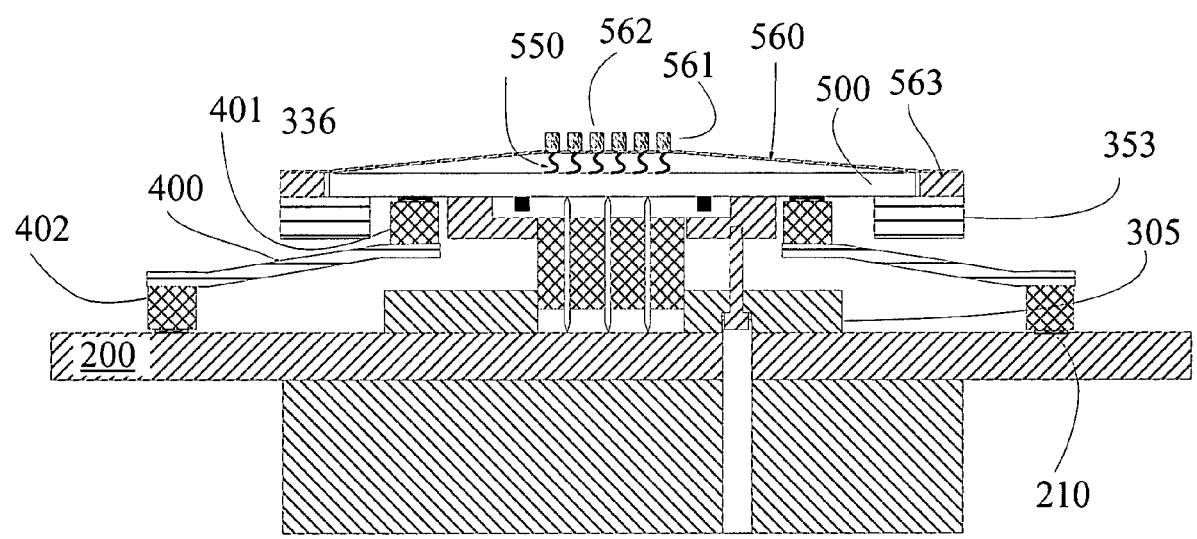
FIG. 25D shows an array contactor probecard with pogo pins for power and ground and thin flexible membrane of tips interfacing to the shorter compliance probes.
Figure 25E:
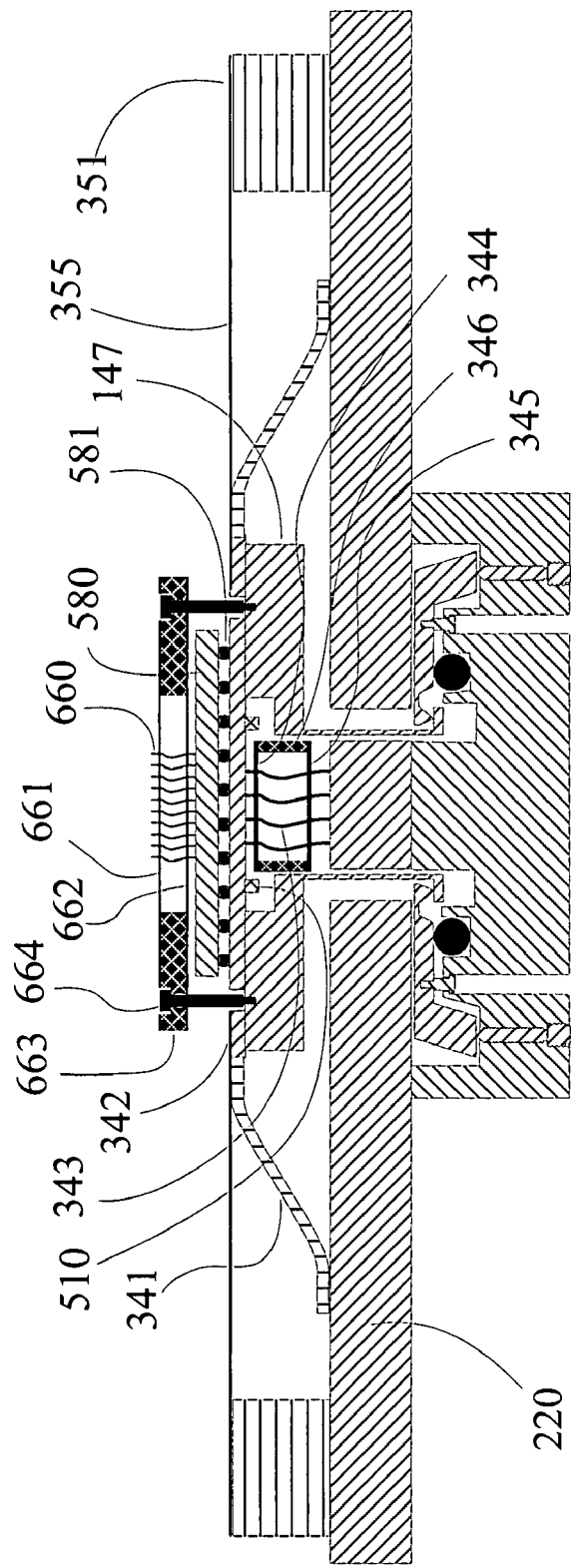
FIG. 25E shows an array probecard with pogo pins for power and ground distribution to an IC package using short buckling beam probes.

FIG. 25A to 25E show the compliance partitioning architecture applied to high density logic applications like microprocessors with 5,000 to 10,000 pads on each die. The architecture allows the probes 550 contacting the IC to be reduced to less than 50% of the length of tradition probes. The input/output signals can be fanned out using thin film interconnect layers on the DUT side of the HDI substrate 500 with controlled impedance routing to the edge of the HDI where the trace density would be low enough for traditional via technology to take the signal to the tester side for connection to a flexible interconnect 400 either directly or through a connector. The connector consists of the flex 400 with solder contacts 511 aligned by a bar 401 on the HDI substrate 500 and gold pressure contacts 210 aligned having pressure applied by bar 402. This flexible interconnect 400 enables higher frequency signal distribution. The flexible interconnect 400 allows the HDI 500 to float and conform to the planarity of the DUT wafer. Under the area of the DUT die on the tester side of the HDI 500, longer and larger compliance springs 410, 343 can be used to connect only the power and ground pads to the PCB 200, 220 This leaves space for capacitors 510 directly under the HDI which helps to reduce inductance to the capacitors. High current AC switching through the longer springs can cause increased noise causing test failures. These longer springs can be Cobra/buckling beam 343 held by mattress assembly which typically will consists of an HDI side template 344 and a PCB side template 346 held by a frame 345 as shown in FIG. 25E or pogo type pins 410 held in a template 411 as shown in FIG. 25A. The architecture because it requires fewer power and ground pins, enables these pins 343, 410 to be larger than the smaller the pins typically used in the industry to interface directly to the DUT being tested. Being larger, they are lower cost and more efficient at handling the high currents (greater than one amp per pin) that are required for these applications. This architecture eliminates the need for power and ground traces in the flexible interconnect 400, which would have greatly increases the cost of the flexible interconnect as well as making the flex interconnects much less flexible. The shorter springs 550 used for the DUT IC pad interface also improve current carrying capabilities since they tend to heat up less at high currents. It is also possible to reduce the number of the longer springs 410 since they are larger and can handle higher current. Typically, a ratio of 4 to 9 DUT side springs 550 to one of these longer tester side springs 410 would be sufficient. This scheme is convenient since the larger springs tend to have a higher maximum spring force and are normally not suitable for this application. In this embodiment, a higher force matching the spring ratio is needed to balance the forces on both sides of the HDI substrate 500. Two types of DUT-side spring interfaces are described: 1) a MEMS coil spring (as shown in FIG. 5) can be designed to keep the total force on probing solder ball contacts to less than 5 grams and 2) a lower cost individually replaceable Cobra/buckling beam type spring 600 which can be up to half the length of traditional springs used for the same application without the compliance partitioning architecture. The new architecture enables "at speed" testing at wafer probe which will result in higher IC yields at both wafer test and final package testing.

Figure 14B:
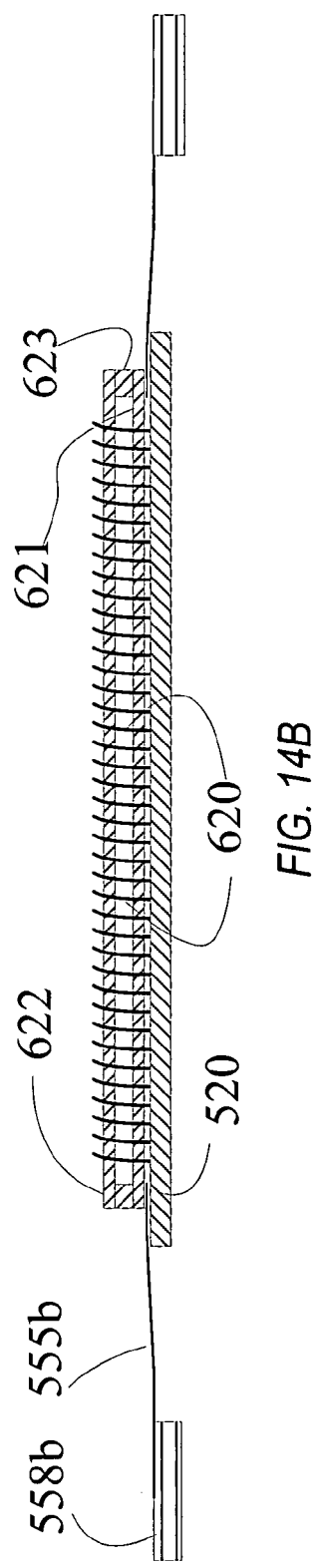
FIG. 14B shows a temperature compensated frame holding buckling beam probes.

FIG. 25A shows the embodiment of the compliance partitioning architecture for the high density logic application. Here the HDI substrate 500, DUT-side springs 550, tester-side springs 410, support frame 351 with wires 350 and the PCB 200 plus stiffener 100 are largely similar in form and function as the full wafer single touchdown application shown in FIG. 13 and 14. But due to the single die or few die nature requiring stepping of the DUT wafer, it is preferable to have a higher preload on the tester side springs 410 and not allow the HDI substrate 500 to flex. This higher preload will reduce the overall compression of the system needed to a level it. This will enable the initial set-up to perform more like users of conventional probecards are accustom to encountering. This preload is achieved by the retaining members 303 and 301. Retaining member 303 is a ring mounted to the tester side of the HDI 500 surrounding the springs 410. The mounting can be done with adhesive, solder or brazing. This ring has three hooks spaced 120 degrees radially to latch onto 3 levers 301. These levers can be adjusted by adjustment screws 101 which tilt the level about the fulcrum point created by shoulder screw 110 against the spring force provided by a rubber O-ring 205 which is retained by a ring 302. This allows the HDI 500 to be moved towards the PCB preloading the springs 410 and leveling the DUT side springs 550 relative to the surface of PCB 200. It is preferred that the location of the hook on ring 303 be placed as close to the center as possible to minimize the force needed to tilt the HDI substrate. The shoulder screw 110 can be accessed during assembly through hole 102 in both the stiffener 100 and PCB 200. The HDI assembly which includes the HDI substrate 500, the DUT side springs 550 and the flexible connector 400 are held fixed in the plane of the PCB 200 by the wire frame assembly through flange 353 which can be attached to the edge of the HDI substrate 500 by adhesive, solder or brazing. The wires 350 are clamped to flange 353 at the mid point of the wire as shown in FIG. 25b by clamp 354. The other side of the wires, as shown in FIG. 25A, are attached to a stainless steel frame 351 and frame 351 can be attached by screws to PCB 200.

FIG. 25B is the top view of the wire suspension arrangement that allows the attached HDI to float and which is shown in cross section of the architecture shown in FIG. 25A. The wire frame including a frame 351, wires 350 and flange 353 constrains the lateral (X-Y) movement while allowing the HDI to float in the vertical (Z) direction. The opening in the wire frame also enable access to attach the four signal flex tapes 400 after the HDI probe head is mounted to the tester PCB. A membrane suspension 356 shown in FIG. 25C performs a similar function as the wire wires 350 but the flex circuits must be connected before mounting the HDI probe head.

Figure 16:
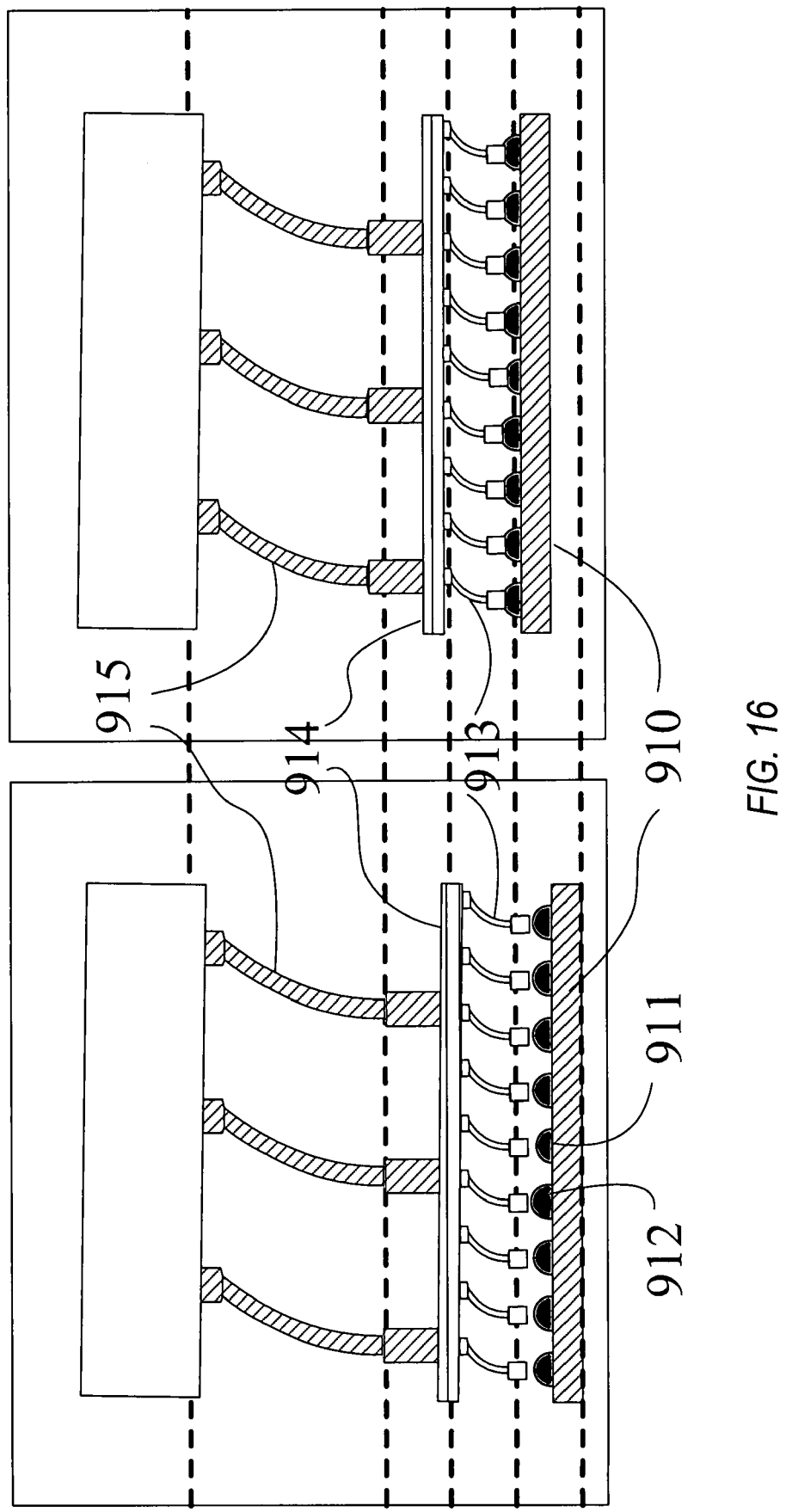
FIG. 16 shows the starting position of the floating HDI prior to making contact to terminals of a device and the final electrical contacting position of the floating HDI after making contact to the device and compensating for a relative tilt of the device.

FIG. 16 show how the floating head supported by the wire frame can compensate for initial tilt of the HDI 914. The left half of FIG. 16 shows the DUT wafer 910 with different height solder balls prior to be tested. For example, solder ball 912 is a large solder ball, and solder ball 911 is a small solder ball. Springs 913 are the shorter DUT-side springs that will contact the solder balls and springs 915 are the tester-side springs that interface between the HDI 914 and the PCB 209. There is an initial tilt in HDI 914 as seen in the left half of FIG. 16. As the prober pushes wafer 910 vertically upward the springs 913 and 915 dynamically balance to bring wafer 910 parallel to the HDI 914 while making electrical contact to the different height solder balls 911 and 912. The orientation of springs 410 away from the perimeter of substrate 500 as seen in FIG. 25A permits tilting of the HDI substrate. This allows the HDI substrate 500 to dynamically align to the orientation of wafer 910.

FIG. 25D shows a connector from HDI 500 to PCB 200 which consist of a signal flex circuit 400 which can make electrical connection through socket 402 which is soldered to PCB 200 and through socket 401 which is soldered to HDI 500. The system of FIG. 25D also shows an embodiment where the contact tips to the DUT pads are held in a thin flexible membrane 560 and have short conductive paths or vias to pads on the backside of the membrane. The springs 550 push against the backside pads which are directly under the raised contacts 561 and contact tips 562 which make contact to the DUT pads. The advantage of this embodiment is that the springs are isolated from the solder balls or other terminals of the DUT. This also enables the use of more optimal tip shapes as well as tip materials than what is available on the spring tips. To clean the tips, the membrane 560 can be removed for chemical cleaning whereas chemical cleaning is not practical for the springs 550. The membrane 560 would be held by a support ring 563 which keeps membrane 560 in tension. The membrane 560 would typically be made of polyimide which has vias connecting bottom side pads to the tip structure on top. The tip structure 561 can be shaped via anisotropic etching of a starting silicon substrate where the etched holes are filled with a suitable noble metal before the normal polyimide spinning and etching steps are performed. The entire structure is then lifted off the silicon substrate after the support ring 563 has been attached to the edges and a release layer is etched.

Another embodiment of the membrane is shown in FIG. 24 for memory testing. In this case the active probe area could be a 300 mm wafer. To keep the contact tips 562 aligned to the pads on the memory wafer, the ring 563 needs to have a CTE close to silicon. Molybdenum is an option for the ring 563 that is capable of being machined to the correct shape.

Figure 26:
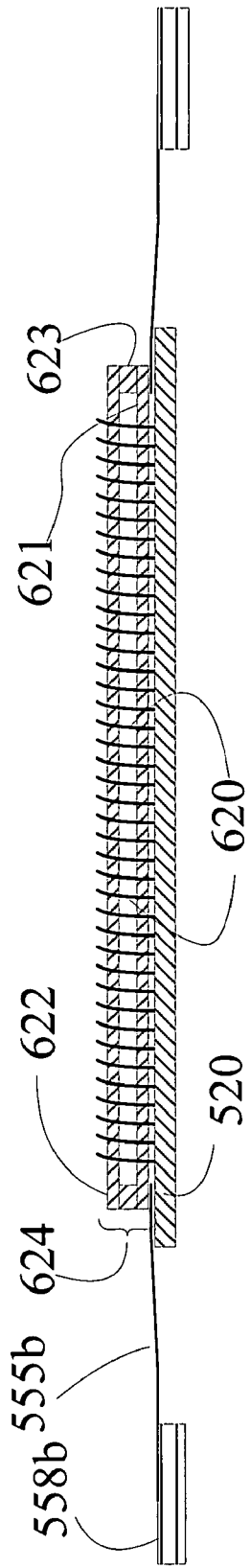
FIG. 26 shows an alternative frame for holding short buckling beam probes in an array probecard.

FIG. 25E is the cross sectional view of a cobra based microprocessor probecard. Instead of using a ceramic HDI for the fan-out to flex circuits and the power/ground pogo probes, a package 580 for the DUT die is soldered using solder balls 581 to a lower cost rigid-flex substrate 342. This substrate has a rigid section where the IC package is soldered, and a flexible section 341 extending out to the connector region to the motherboard PWB. The signal traces are routed out to the outer flex region for connection to the motherboard PWB 220. The power connections are routed vertically through to the pins directly below the rigid portion. These pins 343 are held by mattress assembly which consists of an HDI side template 344 and a PCB side template 346 held by a frame 345 Using the vertically routed pins 343 avoids having thick copper layers for carrying power in the flexible region making them more flexible. The direct power connection also lowers resistance and inductance for the power path. The customer's package 580 acts as a first level of fan-out and reduces the density of routing that must be performed in the HDI. The IC customers buy their IC packages in a much higher volume than the probecard's HDI substrates can be purchased. This combination of a package and rigid-flex opens up the potential of using organic (polyimide) HDIs and significantly reduces the cost of the probecard. Short buckling beam probes 660 are held in a frame 663 which consists of a DUT-side template 661 and a tester-side template 662. The probes make contact on the DUT side to the solder bumps on the DUT and on the tester side to the pads of the IC package 580. The templates 661 and 662 aligning the short springs can be built by stretching polyimide membrane over the top and bottom of the frame and then laser drilling holes in each membrane for aligning the short buckling beam springs 660. The short cobras can have an electrical length similar to the vertical MEMS spring shown in FIG. 5. The MEMS spring can be designed to maintain a force less than 5 grams for over 35 microns of compliance. These short cobras will result in a higher force in a range of 5 and 15 grams for similar compliance. Individual springs for the short cobra probes can be replaced in the field. The MEMS based design requires that the entire die site of springs be unsoldered and a new die site of springs soldered in place. The frame 663 can be designed to extend over the top of the package and attached to the rigid portion of substrate 342 with screws 664 or attached using a wire frame similar to the memory application and shown in FIG. 26.

Although the invention has been described with reference to particular embodiments, the description is only an example of the invention's application and should not be taken as a limitation. Various adaptations and combinations of features of the embodiments disclosed are within the scope of the invention.

What is claimed is:

1. A method comprising:
    attaching a plurality of coupons to an interconnector substrate in a probecard for testing of integrated circuits, wherein each coupon comprises a first set of springs for contacting a device under test and the coupons are respectively attached to the interconnector substrate at attachment points that are separated from where the coupons make electrical contact with the interconnector substrate; and
    repairing the probecard by removing a coupon and replacing the removed coupon with a replacement coupon, wherein the replacement coupon is attached to the interconnector substrate at a spare attachment point that was not attached to the removed coupon.

2. The method of claim 1, wherein each coupon comprises an alignment structure, and attaching the coupon comprises attaching the alignment structure to an alignment pad on the interconnector substrate.

3. The method of claim 1, wherein the springs extend through the coupons, and attaching the coupons comprises for each coupon, pressing tips of the springs that are on an interconnector side of the coupon against a set of noble metal pads on the interconnector substrate.

4. The method of claim 3, wherein spring forces from compression of the springs are sufficient to make reliable contacts to the noble metal pads on the interconnector substrate.

5. The method of claim 3, wherein the tips comprise rhodium, palladium-cobalt, or hard gold.

6. The method of claim 1, wherein attaching each of the coupons comprises pressure fitting the coupon onto a post on the interconnector substrate.

7. The method of claim 1, wherein attaching the coupons comprises attaching the coupons to respective alignment pads on the interconnector substrate.

8. The method of claim 7, wherein each of the coupons has a stud that is attached to the alignment pad on the substrate by a brazing process.

9. The method of claim 7, wherein replacing the coupon comprises attaching the replacement coupon to a spare alignment pad on the interconnector substrate.

10. The method of claim 1, wherein replacing the coupon comprises attaching the replacement coupon to an extra alignment point that has an unused attachment surface.

11. The method of claim 1, wherein attaching the coupons comprises for each coupon, pressing tips of a second set of springs that extend from an interconnector side of the coupon against a set of noble metal pads on the interconnector substrate.

12. The method of claim 11, wherein spring forces from compression of the second set of springs are sufficient to make reliable contacts to the noble metal pads on the interconnector substrate.

13. The method of claim 11, wherein the tips comprise rhodium, palladium-cobalt, or hard gold.

14. A method comprising:
attaching a plurality of coupons to an interconnector substrate in a probecard for testing of integrated circuits, wherein each coupon comprises a set of springs for contacting a device under test and each coupon is attached to the interconnector substrate at an attachment point that is separated from where the coupon makes electrical contact with the interconnector substrate; and
repairing the probecard by removing and replacing a coupon, wherein:
attaching each of the coupons comprises pressure fitting the coupon to the interconnector substrate; and
the repairing of the probecard comprises cutting the attachment point to release the coupon from the interconnector substrate.

15. A method comprising:
attaching a plurality of coupons to an interconnector substrate in a probecard for testing of integrated circuits, wherein each coupon comprises a set of springs for contacting a device under test and each coupon is attached to the interconnector substrate at a point that is separated from where the coupon makes electrical contact with the interconnector substrate; and
repairing the probecard by removing and replacing a coupon, wherein:
attaching the coupons comprises attaching the coupons to respective alignment pads on the interconnector substrate; and
each of the coupons has a stud that is attached to the alignment pad on the interconnector substrate by using an adhesive.

16. A method comprising:
attaching a plurality of coupons to an interconnector substrate in a probecard for testing of integrated circuits, wherein each coupon comprises a set of springs for contacting a device under test and each coupon is attached to the interconnector substrate at a point that is separated from where the coupon makes electrical contact with the interconnector substrate; and
repairing the probecard by removing and replacing a coupon, wherein:
attaching the coupons comprises attaching the coupons to respective alignment pads on the interconnector substrate; and
each of the coupons has a stud that is attached to the alignment pad on the interconnector substrate by using a solder.

17. The method of claim 16, wherein removing the coupon comprises heating the stud to soften the solder and release the coupon from the interconnection substrate.

18. A method comprising:
attaching a plurality of coupons to an interconnector substrate in a probecard for testing of integrated circuits, wherein each coupon comprises a set of springs for contacting a device under test and each coupon has an attachment point that is attached to the interconnector substrate and is separated from where the coupon makes electrical contact with the interconnector substrate; and
repairing the probecard by removing and replacing a coupon, wherein removing the coupon comprises cutting the attachment point to thereby release the coupon from the interconnector substrate.

19. A method comprising:
attaching a plurality of coupons to an interconnector substrate in a probecard for testing of integrated circuits, wherein each coupon comprises a flexible membrane, a set of springs with first spring ends for contacting a device under test and second spring ends contacting electrical contacts on the interconnector, and wherein the coupons are affixed to the interconnector substrate at respective attachment points that are separated from the electrical contacts of the interconnector substrate; and
repairing the probecard by:
removing one of the coupons; and
attaching a replacement coupon in place of the coupon removed, wherein the replacement coupon comprises a flexible membrane, a set of springs with first spring ends for contacting a device under test and second spring ends respectively contacting the electrical contacts on the interconnector, the replacement coupon being affixed to the interconnector substrate at an attachment point that is separated from where the replacement coupon makes electrical contact with the interconnector substrate.

20. The method of claim 19, wherein in each coupon, each of the springs extends through the membrane and provides one of the first ends and one of the second ends.

21. The method of claim 19, wherein attaching the replacement coupon affixes the replacement coupon to the attachment point at which the removed coupon was affixed to the interconnector.

22. The method of claim 19, wherein attaching the plurality of coupons to the interconnector leaves unused a spare attachment point at which the replacement coupon is affixed to the interconnector.

23. The method of claim 22, wherein repairing the probecard comprises cutting the attachment point to release the coupon from the interconnect substrate.

24. The method of claim 19, wherein repairing the probecard further comprises aligning the replacement coupon relative to the interconnect substrate as needed for testing integrated circuits and then affixing the replacement coupon to the interconnector.

25. The method of claim 19, wherein attaching the plurality of coupons to the interconnector substrate relies on spring force from compression of the springs to provide electrical connection to the interconnector without being affixed.

26. The method of claim 19, wherein the attachment point on the coupon comprises a structure composed of the same material as the springs on the coupon.

27. The method of claim 19, wherein the attachment point on the coupon is attached to the interconnect substrate using an attachment material that can be softened to allow removal of the membrane coupon from the interconnect substrate.

28. The method of claim 27, wherein the attachment material is solder.

29. The method of claim 27, wherein the attachment material is epoxy.

30. The method of 19, wherein attaching each of the coupons comprises pressure fitting the coupon to the interconnect substrate.

31. The method of claim 19, wherein the first spring ends comprise a tip made from a material selected from a group consisting of rhodium, palladium-cobalt, and hard gold.

* * * * *